(12) United States Patent
Ushikusa et al.

(10) Patent No.: US 11,380,546 B2
(45) Date of Patent: Jul. 5, 2022

(54) DEPOSITION MASK, DEPOSITION MASK APPARATUS, MANUFACTURING METHOD OF DEPOSITION MASK, AND MANUFACTURING METHOD OF DEPOSITION MASK APPARATUS

(71) Applicant: Dai Nippon Printing Co., Ltd., Tokyo (JP)

(72) Inventors: Masato Ushikusa, Tokyo (JP); Yusuke Nakamura, Tokyo (JP); Hideyuki Okamoto, Tokyo (JP); Yoshinori Murata, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/726,431

(22) Filed: Dec. 24, 2019

(65) Prior Publication Data

US 2020/0152463 A1 May 14, 2020

Related U.S. Application Data

(63) Continuation of application No. PCT/JP2018/023065, filed on Jun. 18, 2018.

(30) Foreign Application Priority Data

Jul. 5, 2017 (JP) .............................. JP2017-132162

(51) Int. Cl.
*H01L 21/033* (2006.01)
*H01L 51/50* (2006.01)
(Continued)

(52) U.S. Cl.
CPC .......... *H01L 21/0337* (2013.01); *C23C 14/04* (2013.01); *C23C 14/24* (2013.01);
(Continued)

(58) Field of Classification Search
None
See application file for complete search history.

(56) References Cited

U.S. PATENT DOCUMENTS 6,890,385 B2 5/2005 Tsuchiya et al.
2012/0234236 A1 9/2012 Ko et al.
(Continued)

FOREIGN PATENT DOCUMENTS

CN 1480011 A 3/2004
CN 105814232 A 7/2016
(Continued)

OTHER PUBLICATIONS

Taiwanese Office Action (Application No. 107122267) dated Mar. 7, 2019 (with English translation).

(Continued)

*Primary Examiner* — Jiong-Ping Lu
(74) *Attorney, Agent, or Firm* — Burr & Brown, PLLC

(57) ABSTRACT

A deposition mask includes: a first mask having an opening formed therein; and a second mask superposed on the first mask and having a plurality of through-holes formed therein, the through-hole having a planar dimension smaller than a planar dimension of the opening; wherein: the deposition mask has a plurality of joints that join the second mask and the first mask to each other; the plurality of joints are arranged along an outer edge of the second mask; and a notch is formed at a position in the outer edge of the second mask, the position corresponding to a space between the adjacent two joints.

5 Claims, 17 Drawing Sheets

(51) Int. Cl.
  *H05B 33/10* (2006.01)
  *C23C 14/04* (2006.01)
  *C23C 14/24* (2006.01)
  *H01L 51/00* (2006.01)

(52) U.S. Cl.
  CPC ........ *H01L 21/0332* (2013.01); *H01L 51/001* (2013.01); *H01L 51/0011* (2013.01); *H01L 51/50* (2013.01); *H05B 33/10* (2013.01); *C23C 14/042* (2013.01)

(56) References Cited

U.S. PATENT DOCUMENTS

| | | | |
|---|---|---|---|
| 2013/0205568 A1* | 8/2013 | Ko | B05C 11/00 29/458 |
| 2014/0331926 A1 | 11/2014 | Kim | |
| 2016/0043319 A1* | 2/2016 | White | G02B 26/02 359/230 |
| 2016/0288163 A1 | 10/2016 | Mizumura | |
| 2016/0293844 A1 | 10/2016 | Takeda et al. | |
| 2016/0310988 A1* | 10/2016 | Lee | H01L 51/00 |
| 2018/0209028 A1 | 7/2018 | Li et al. | |
| 2018/0334740 A1 | 11/2018 | Ikenaga et al. | |

FOREIGN PATENT DOCUMENTS

| | | |
|---|---|---|
| CN | 106086781 A | 11/2016 |
| CN | 103781935 B | 7/2017 |
| CN | 208485938 U | 2/2019 |
| EP | 3 556 899 A1 | 10/2019 |
| JP | H08-085869 A1 | 4/1996 |
| JP | 2005-268822 A1 | 9/2005 |
| JP | 2006-124761 A1 | 5/2006 |
| JP | 4562488 B2 | 10/2010 |
| JP | 4606114 B2 | 1/2011 |
| JP | 2014-529011 A1 | 10/2014 |
| JP | 2016-148112 A1 | 8/2016 |
| KR | 2010-0114685 A | 10/2010 |
| WO | 2013/026493 A1 | 2/2013 |
| WO | 2015/087936 A1 | 6/2015 |
| WO | 2017/057621 A1 | 4/2017 |

OTHER PUBLICATIONS

Chinese Office Action (Application No. 201810729647.6) dated Mar. 16, 2020 (with English translation).
Chinese Office Action (Application No. 201810729647.6) dated Jun. 1, 2020 (with English translation).
English translation of International Preliminary Report on Patentability (Chapter I) (Application No. PCT/JP2018/023065) dated Jan. 16, 2020, 7 pages.
International Search Report and Written Opinion (Application No. PCT/JP2018/023065) dated Aug. 14, 2018.
Extended European Search Report (Application No. 18827999.6) dated Mar. 19, 2021.
Korean Office Action (Application No. 10-2020-7003256) dated Aug. 16, 2021 (with English translation).
Korean Office Action (Application No. 10-2020-7003256) dated Jan. 26, 2022 (with English translation).

* cited by examiner

DEPOSITION MASK, DEPOSITION MASK APPARATUS, MANUFACTURING METHOD OF DEPOSITION MASK, AND MANUFACTURING METHOD OF DEPOSITION MASK APPARATUS

CROSS-REFERENCE TO RELATED APPLICATIONS

The present application is a continuation application of International Application No. PCT/JP2018/023065 filed on Jun. 18, 2018, which claims priority to Japanese Patent Application No. 2017-132162 filed on Jul. 5, 2017. The contents of PCT/JP2018/023065 and Japanese Patent Application No. 2017-132162 are incorporated herein by reference in their entirety.

TECHNICAL FIELD

The present disclosure relates to a deposition mask that is used for depositing a deposition material onto a substrate to be deposited (a substrate onto which the deposition material is deposited), a deposition mask apparatus, a manufacturing method of a deposition mask, and a manufacturing method of a deposition mask apparatus.

BACKGROUND ART

A display device used in a portable device such as a smart phone and a tablet PC is required to have high fineness, e.g., a pixel density of not less than 400 ppi. In addition, there is increasing demand that the portable device is applicable in the ultra full high-definitions reference. In this case, the pixel density of the display device needs to be not less than 800 ppi or more, for example.

An organic EL display device draws attention because of its excellent responsibility, low power consumption and excellent contrast. A known method for forming pixels of an organic EL display device is a method which uses a deposition mask including through-holes that are arranged in a desired pattern, and forms pixels in the desired pattern. To be specific, a substrate for an organic EL display device (substrate for organic EL) is firstly put into a deposition apparatus. Then, a deposition step in which a deposition mask is brought into contact with the substrate for organic EL so as to deposit an organic material onto the substrate for organic EL is carried out in the deposition apparatus.

A deposition mask disclosed in JP2016-148112A can be given as an example of such a deposition mask. The deposition mask disclosed in JP2016-148112A is manufactured by a plating process. A conductive pattern is formed on an insulating substrate, and then a metal layer is formed on the conductive pattern by means of an electrolytic plating method. Thereafter, by removing the substrate and the conductive pattern, a deposition mask with the metal layer can be obtained. This technique is advantageous in that a thinned deposition mask can be obtained because the deposition mask is manufactured by a plating process. According to the thinned deposition mask, a deposition material which moves toward a substrate to be deposited such as an a substrate for organic EL from a direction that is largely inclined with respect to a normal direction of a plate surface of the deposition mask can be allowed to suitably adhere to the substrate to be deposited exposed to through-holes of the deposition mask.

In the technique disclosed in JP2016-148112A, a deposition mask is manufactured by using a plating process, and then the deposition mask is attached to a frame so as to manufacture a deposition mask apparatus. The frame of the deposition mask apparatus holds the deposition mask in a tensioned condition. Namely, tension is applied to the deposition mask which is fixed on the frame. Thus, the deposition mask is prevented from being bent. However, the present inventors have found that, since tension is applied to the thinned deposition mask, the deposition mask is disadvantageously wrinkled and/or deformed.

In order to solve this problem, the present inventors have worked out the manufacture of a deposition mask and a deposition mask apparatus in the following method. Firstly, for example, a conductive pattern made of a conductive material, such as copper, is provided on a substrate. A metal layer which will serve as a deposition mask is provided on the conductive pattern, so as to produce a laminated body including the substrate, the conductive pattern and the metal layer. Then, the metal layer of the laminated body is joined to a frame by welding, for example. Thereafter, the conductive pattern is etched and removed, and the substrate is separated from the metal layer. Thus, a deposition mask formed of the metal layer, and a deposition mask apparatus having the deposition mask and the frame can be manufactured. According to such a method, since the metal layer of the laminated body, which will serve as the deposition mask, is joined to the frame while the metal layer is being held on the substrate, flatness of the deposition mask can be well ensured. Thus, it is considered that the deposition mask can be prevented from being wrinkled and/or deformed.

However, the present inventors have found the following problem in this method. When the deposition mask is a metal layer that is precipitated by using a plating method, a residual stress (internal stress) is generated in the metal layer, so that a tensile force may be generated in a plane of the metal layer. A power of the tensile force varies depending on a thickness and/or a composition of the metal layer. The deposition mask formed of a plated layer inevitably has non-uniform thickness and/or composition in its plane. In this case, the tensile force in the plane of the deposition mask may become non-uniform. Thus, in the deposition mask from which a substrate has been removed, there is a possibility that positions of respective through-holes are displaced from predetermined positions, because of the non-uniform tensile force in the plane.

SUMMARY

The present disclosure has been made in view of the above circumstances. The object of the present disclosure is to provide a deposition mask, a deposition mask apparatus, and a manufacturing method of a deposition mask and a deposition mask apparatus, capable of preventing positional displacement of through-holes.

A deposition mask of the present disclosure comprises:

a first mask having an opening formed therein; and a second mask superposed on the first mask and having a plurality of through-holes formed therein, the through-hole having a planar dimension smaller than a planar dimension of the opening;

wherein:

the deposition mask has a plurality of joints that join the second mask and the first mask to each other;

the plurality of joints are arranged along an outer edge of the second mask; and a notch is formed at a position in the outer edge of the second mask, the position corresponding to a space between the adjacent two joints.

A deposition mask of the present disclosure comprises the aforementioned deposition mask, and a frame attached to the deposition mask.

A manufacturing method of a deposition mask of the present disclosure is a manufacturing method of a deposition mask including a first mask in which a plurality of openings arranged at least along a first direction are formed, and a second mask superposed on the first mask and having a plurality of through-holes formed therein, the through-hole having a planar dimension smaller than a planar dimension of the opening, the manufacturing method comprising:

a joint step in which a metal layer of a laminated body is joined to the first mask by a plurality of joints, wherein the laminated body includes a substrate, a conductive pattern provided on the substrate, and the metal layer provided on the conductive pattern on the opposite side of the substrate; and a separation step in which the substrate is separated from the metal layer by etching and removing the conductive pattern so as to form the second mask from the metal layer.

In the manufacturing method of a deposition mask of the present disclosure, the plurality of joints may be arranged along an outer edge of the metal layer; and a notch may be formed at a position in the outer edge of the metal layer, the position corresponding to a space between the two joints that are adjacent to each other in the arrangement direction of the plurality of joints.

A manufacturing method of a deposition mask apparatus of the present disclosure is a manufacturing method of a deposition mask apparatus including a deposition mask and a frame attached to the deposition mask, the manufacturing method comprising:

a preparation step in which the aforementioned deposition mask, or a deposition mask manufactured by the aforementioned manufacturing method of a deposition mask, is prepared; and an attachment step in which the deposition mask is attached to a frame.

The manufacturing method of a deposition mask apparatus of the present disclosure may further comprises, before the attachment step, a stretching step in which the deposition mask is stretched in a planar direction thereof.

The present disclosure can provide a deposition mask, a deposition mask apparatus, and a manufacturing method of a deposition mask and a deposition mask apparatus, capable of restraining positional displacement of through-holes.

DESCRIPTION OF EMBODIMENTS

Figure 1:
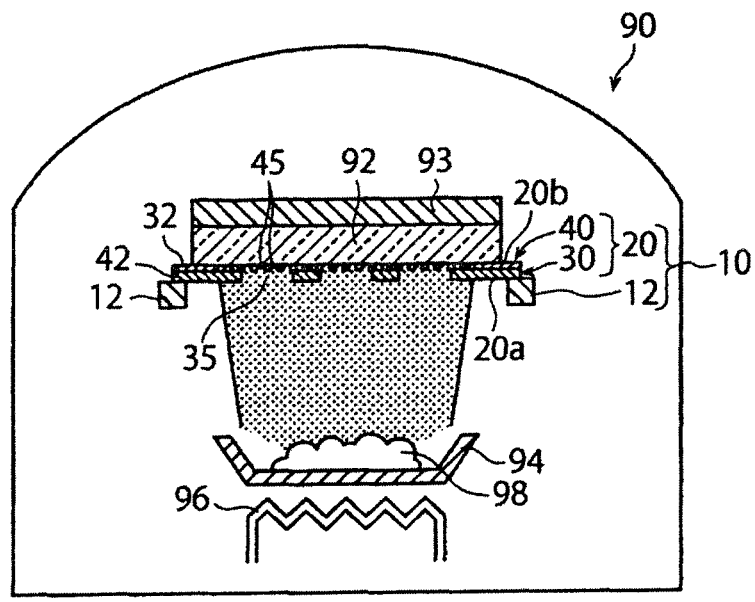
FIG. 1 is a view for describing an embodiment of the present disclosure, which describes a deposition apparatus having a deposition mask apparatus, and a deposition method using the deposition apparatus.

The below-described embodiments are examples of the embodiment of the present disclosure, and the present disclosure should not be limited to the embodiments.

An embodiment of the present disclosure is described with reference to the drawings. In the drawings attached to the specification, a scale dimension, an aspect ratio and so on are changed and exaggerated from the actual ones, for the convenience of easiness in illustration and understanding.

FIGS. 1 to 31 are views for describing an embodiment of the present disclosure. In the below embodiment, a deposition mask apparatus used for patterning an organic material on a substrate in a desired pattern in order to manufacture an organic EL display device, and a manufacturing method of the deposition mask apparatus are described by way of example. However, the present disclosure is not limited to this application, and can be applied to a deposition mask apparatus used for various purposes and a manufacturing method of the deposition mask apparatus.

In this specification, the terms "plate", "sheet" and "film" are not differentiated from one another, based only on the difference in terms. For example, the "plate" is a concept including a member that can be referred to as "sheet" or "film".

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A planar direction used for a plate-like (sheet-like, film-like) member means a direction parallel to a plate plane (sheet plane, film plane) of the member. In addition, a normal direction used to the plate-like (sheet-like, film-like) member means a normal direction with respect to a plate plane (sheet surface, film surface) of the member.

Further, the terms used herein specifying shapes, geometric conditions, physical properties, and their degrees, e.g., "parallel," "perpendicular," "same," "similar" etc., and values of lengths and angles as well as physical properties are not limited to their strict definitions, but construed to include a range capable of exerting a similar function.

Firstly, a deposition apparatus 90 for performing a deposition process for depositing a deposition material onto an object is explained with reference to FIG. 1. As shown in FIG. 1, the deposition apparatus 90 includes therein a deposition source (e.g., a crucible 94), a heater 96, and a deposition mask apparatus 10. In addition, the deposition apparatus 90 may further include exhaust means to create a vacuum atmosphere inside of the deposition apparatus 90. The crucible 94 accommodates a deposition material 98 such as an organic luminescent material. The heater 96 is configured to heat the crucible 94 so as to evaporate the deposition material 98 in the vacuum atmosphere. The deposition mask apparatus 10 is located opposite to the crucible 94.

As shown in FIG. 1, the deposition mask apparatus 10 includes a deposition mask 20 and a frame 12 for supporting the deposition mask 20. The frame 12 is configured to support the deposition mask 20 to pull it in a taut state in its planar direction in order to prevent the deposition mask 20 from warping. As shown in FIG. 1, the deposition mask apparatus 10 is disposed in the deposition apparatus 90 such that the deposition mask 20 faces a substrate 92 to be deposited (e.g., a substrate for organic EL), which is an object onto which the deposition material 98 is to be deposited.

As shown in FIG. 1, the deposition mask apparatus 10 may include a magnet 93 disposed on a surface of the substrate for organic EL 92, which is opposite to the surface on the deposition mask 20 side. By providing the magnet 93, the deposition mask 20 can be attracted to the magnet 93 by magnetic force, so that the deposition mask 20 can be brought into tight contact with the substrate to be deposited 92.

As shown in FIG. 1, the deposition mask 20 includes a first mask 30 and a second mask 40 superposed on the first mask 30. The first mask 30 has a plate member 32 and a plurality of openings 35 formed in the plate member 32. In addition, the second mask 40 has a metal layer 42 and a plurality of through-holes 45 formed in the metal layer 42. For example, a thickness of the first mask 30 is not less than 50 μm and not more than 3000 μm, and a thickness of the second mask 40 is not less than 2.5 μm and not more than 30 μm. The through-hole 45 has a planar dimension smaller than a planar dimension of the opening 35. The description that the through-hole 45 has a planar dimension smaller than a planar dimension of the opening 35 means that the dimension of the through-hole 45 is smaller than the dimension of the opening 35 in all the directions along a plate plane of the first mask 30 (a plate plane of the second mask 40). Thus, in the example shown in FIGS. 3 and 7, in a plan view, an outline delimiting the opening 35 surrounds outlines delimiting the through-holes 45 positioned in the opening 35. A maximum dimension of the through-hole 45 in the planar direction is not less than 5 μm and not more than 100 μm, for example. The through-hole 45 of the second mask 45 is also formed at a position that is not overlapped with the opening 35 of the first mask 30. In a plan view, the through-hole 45 may have a slit-like shape having a longitudinal direction and a width direction orthogonal to the longitudinal direction. In this case, a maximum width of the through-hole 45 along the width direction may be not less than 5 μm and not more than 100 μm, for example.

As shown in FIG. 1, the deposition mask 20 has a first surface 20a and a second surface 20b that defines a surface opposite to the first surface 20a. In the illustrated example, the deposition mask 20 is disposed between the substrate to be deposited 92 and the crucible 94. The deposition mask 20 is supported in the deposition apparatus 90 such that its second surface 20b faces a lower surface of the substrate to be deposited 92, in other words, such that its first surface 20a faces the crucible 94, and is used for depositing the deposition material 98 onto the substrate to be deposited 92. In the deposition apparatus 90 shown in FIG. 1, the deposition material 98 evaporated from the crucible 94 to reach the deposition mask 20 from the first surface 20a side adheres to the substrate to be deposited 92 through the openings 35 of the first mask 30 and the through-holes 45 of the second mask 40. Thus, the deposition material 98 can be film-deposited onto the surface of the substrate to be deposited 92 in a desired pattern corresponding to the positions of the openings 35 of the first make 30 and the through-holes 45 of the second mask 40.

Figure 2:
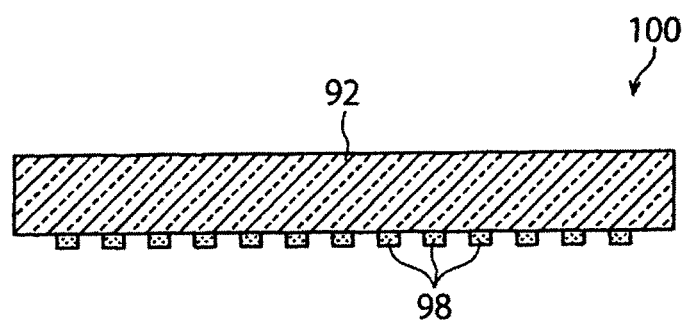
FIG. 2 is a cross-sectional view showing an example of an organic EL display device manufactured by the deposition apparatus shown in FIG. 1.

FIG. 2 is a cross-sectional view showing an organic EL display device 100 manufactured by using the deposition apparatus 90 of FIG. 1. The organic EL display device 100 includes the substrate to be deposited (substrate for organic EL) 92 and patterned pixels containing the deposition materials 98.

When a color display is desired with a plurality of colors, deposition apparatuses 90 equipped with deposition masks 20 corresponding to the respective colors are prepared, and the substrate to be deposited 92 is introduced into each deposition apparatus 90. Accordingly, for example, an organic luminescent material for red color, an organic luminescent material for green color, and an organic luminescent material for blue color can be sequentially deposited on the substrate to be deposited 92.

The deposition process is sometimes performed inside the deposition apparatus 90 in a high-temperature atmosphere.

In this case, during the deposition process, the deposition mask 20, the frame 12, and the substrate to be deposited 92, which are held inside the deposition apparatus 90, are also heated. At this time, the first mask 30 and the second mask 40 of deposition mask 20, the frame 12, and the substrate to be deposited 92 develop dimensional change behaviors based on their respective thermal expansion coefficients. In this case, when the thermal expansion coefficients of the first mask 30, the second mask 40, the frame 12 and the substrate to be deposited 92 largely differ from one another, positioning displacement occurs because of the difference in dimensional change. As a result, dimensional precision and/or positional precision of the deposition material deposited onto the substrate to be deposited 92 decrease.

In order to solve this problem, the thermal expansion coefficients of the first mask 30, the second mask 40 and the frame 12 are preferably equivalent to the thermal expansion coefficient of the substrate to be deposited 92. For example, when a glass substrate is used as the substrate to be deposited 92, an iron alloy containing nickel can be used as a main material of the first mask 30, the second mask 40 and the frame 12. For example, it is possible to use, as a material for forming the first mask 30, the second mask 40 and the frame 12, an iron alloy containing not less than 30% by mass and not more than 54% by mass of nickel. Specific examples of an iron alloy containing nickel may be an invar material containing not less than 34% by mass and not more than 38% by mass of nickel, a super invar material containing cobalt in addition to not less than 30% by mass and not more than 34% by mass of nickel, and a low thermal expansion Fe—Ni based plated alloy not less than 38% by mass and not more than 54% by mass of nickel.

When the temperatures of the first mask 30, the second mask 40, the frame 12 and the substrate to be deposited 92 do not reach high temperatures during the deposition process, it is not necessary that the thermal expansion coefficients of the first mask 30, the second mask 40 and the frame 12 are equivalent to the thermal expansion coefficient of the substrate to be deposited 92. In this case, a material other than the aforementioned iron alloy may be used as the material forming the first mask 30 and the second mask 40. For example, an alloy other than the aforementioned iron alloy containing nickel, such as an iron alloy containing chromium, may be used. As an iron alloy containing chromium, for example, an iron alloy, which is called so-called stainless steel, can be used. In addition, alloys such as a nickel or nickel-cobalt alloy other than iron alloys may be used.

Figure 3:
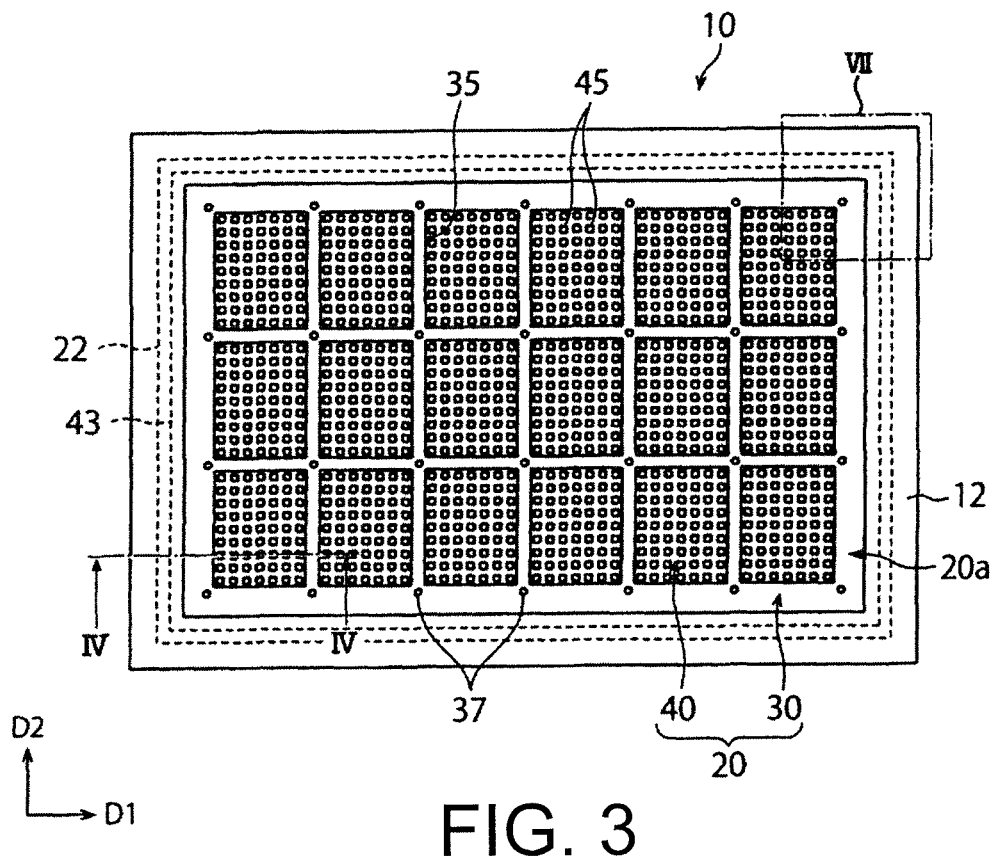
FIG. 3 is a plan view schematically showing the deposition mask apparatus having the deposition mask.
Figure 4:
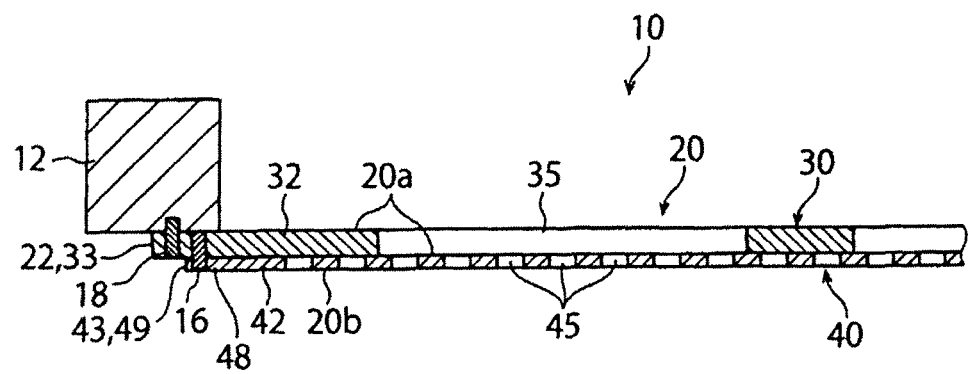
FIG. 4 is a cross-sectional view of the deposition mask apparatus corresponding to a IV-IV line in FIG. 3.

Next, the deposition mask apparatus 10 and the deposition mask 20 are described in detail with reference to FIGS. 1 and 3 to 7. FIG. 3 is a plan view schematically showing an example of the deposition mask apparatus 10 having the deposition mask 20, the deposition mask apparatus 10 being seen from the first surface 20 side. FIG. 4 is a cross-sectional view of the deposition mask apparatus 10, which shows the deposition mask 10 in a cross-section corresponding to a VI-VI line of FIG. 3.

In the example shown in FIG. 3, the deposition mask 20 has an outline of, for example, a substantially quadrangular shape in a plan view, more precisely, a substantially rectangular shape in a plan view. The frame 12 is formed as a substantially rectangular frame. The deposition mask 20 is attached to the frame 12 such that each side of the deposition mask 20 corresponds to each side of the frame 12.

The deposition mask 20 has the first mask 30 and the second mask 40 stacked on each other. In the example shown in FIGS. 1, 3 and 4, the second mask 40 is disposed on the second surface 20b side with respect to the first mask 30. Thus, the surface of the first mask 30, which is opposite to the second mask 40, and the surface of the second mask 40, which is exposed from the opening 35 of the first mask 30, define the first surface 20a of the deposition mask 20. The surface of the second mask 40, which is opposed to the first mask 30, defines the second surface 20b of the deposition mask 20. In the illustrated example, the first mask 30 and the second mask 40 respectively have a substantially rectangular outline in a plan view. Particularly in the illustrated example, the first mask 30 has a planar dimension larger than a planar dimension of the second mask 40. In a plan view, the outline delimiting the first mask 30 surrounds the outline delimiting the second mask 40.

The first mask 30 and the second mask 40 of the deposition mask 20 are fixed to each other. To this end, the deposition mask 20 has a plurality of first joints 16 that join the first mask 30 and the second mask 40 to each other. In addition, the first mask 30 and the frame 12 are fixed to each other. To this end, the deposition mask apparatus 10 has a plurality of second joints 18 that join the first mask 30 and the frame 12 to each other. The joints 16, 18 are respectively arranged along an outer edge 22 of the deposition mask 20. Particularly in the illustrated example, the outer edge 22 of the deposition mask 20 and an outer edge 43 of the second mask 40 extend parallel to each other, i.e., along the same direction. As described above, in the illustrated example, the deposition mask 20 has the substantially rectangular outline in a plan view. Thus, the joints 16, 18 are also arranged in a substantially rectangular pattern along the outer edge 22 of the deposition mask 20. In the example shown in FIG. 7, the joints 16, 18 are respectively arranged linearly with a certain distance from the outer edge 22 of the deposition mask 20. Namely, the joints 16, 18 are arranged respectively along a direction parallel to the direction in which the outer edge 22 of the deposition mask 20 extends. In addition, in the illustrated example, the joints 16, 18 are respectively arranged equidistantly along the direction in which the outer edge 22 extends. In this specification, the description that the joints 16, 18 are arranged along the outer edges 22, 43 means that the joints 16, 18 are arranged at least along a part of the entire circumferences of the outer edges 22, 43. In the illustrated example, the joints 16, 18 are arranged along the entire circumferences of the outer edges 22, 43. However, not limited thereto, the joints 16, 18 may be arranged along only two opposed sides of the entire circumferences of the outer edges 22, 43. In this embodiment, the first mask 30 and the second mask 40 are fixed to each other by spot welding. Thus, the respective first joints 16 and the second joints 18 are formed as joints by spot welding. However, not limited thereto, the first mask 30 and the second mask 40, and/or the first mask 30 and the frame 12 may be fixed to each other by another fixing means such as an adhesive. Namely, the respective first joints 16 and the second joints 18 may be formed as adhesive parts.

Figure 5:
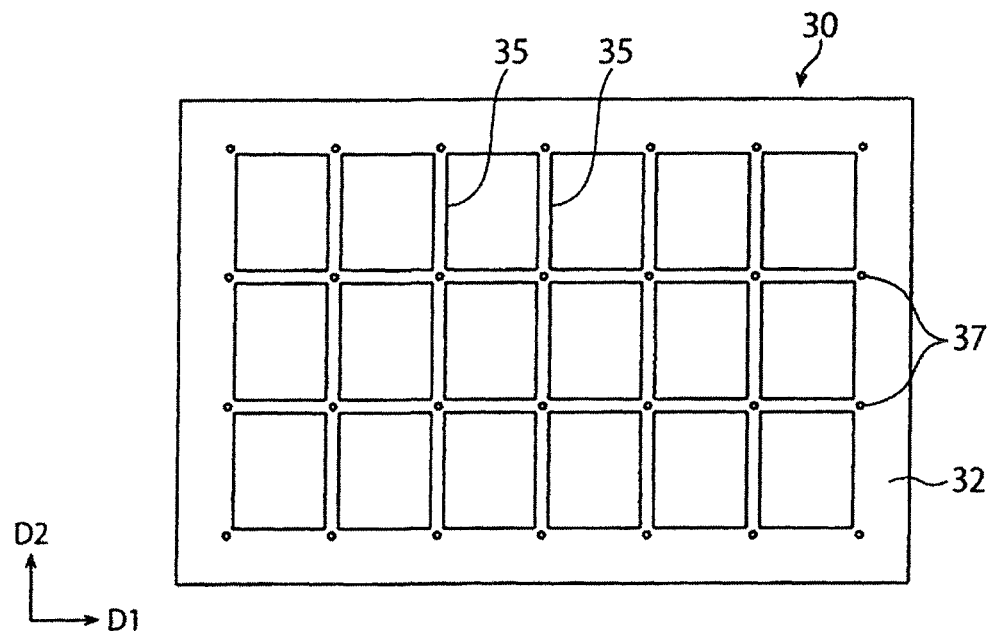
FIG. 5 is a plan view showing an example of a first mask of the deposition mask.

Next, the first mask 30 is described. FIG. 5 is a plan view showing the first mask 30 of the deposition mask apparatus 10 of FIG. 3. In the illustrated example, the first mask 30 has the plurality of openings 35 which are arranged at predetermined pitches along a first direction D1 and a second direction D2. The first direction D1 and the second direction D2 are directions both parallel to a plane direction of the plate member 32 of the first mask 30. In addition, the second direction D2 is orthogonal to the first direction D1. In this embodiment, the first mask 30 having a single layer is described by way of example. However, not limited thereto, the first mask 30 may have a plurality of layers. Namely, the first mask 30 may be produced by laminating a plurality of layers along its plate plane direction.

One opening 35 of the first mask 30 corresponds to one display area of the organic EL display device 100. Therefore, the illustrated deposition mask apparatus 10 enables a multifaceted deposition of the organic EL display device 100, correspondingly to the respective openings 35 of the first mask 30.

As shown in FIGS. 3 and 5, the opening 35 has an outline of, for example, a substantially quadrangular shape in a plan view, more precisely, a substantially rectangular shape in a plan view. However, although not shown, each opening 35 can have an outline of a different shape in accordance with the shape of the display area of the substrate to be deposited (substrate for organic EL) 92. For example, each opening 35 may have a circular outline. FIG. 3 shows that the respective openings 35 have the same shape with each outer in a plan view. However, not limited thereto, the respective openings 35 may have opening shapes different from one another. In other words, the first mask 30 may have a plurality of openings 35 having different shapes in a plan view.

In the illustrated example, an alignment mark 37 is provided near a corner of each opening 35 of the first mask 30.

In particular, one opening 35 is provided, correspondingly to four corners thereof, with four alignment marks 37. In the illustrated example, some (e.g., two) alignment marks 37 are shared by the openings 35 adjacent to each other. The alignment marks 37 are used when relative positions between the respective through-holes 45 of the second mask 40 exposed into the respective opening 35 are aligned with predetermined positions, in a stretching step performed in a manufacturing method of the deposition mask apparatus 10 described later. A specific shape of the alignment mark 37 is not specifically limited, as long as it can be recognized by an imaging device such as a camera. Alignment of the through-holes 45 using these alignment marks 37 can be carried out similarly to the method described in JP4606114B2 or JP4562488B2, for example.

Figure 6:
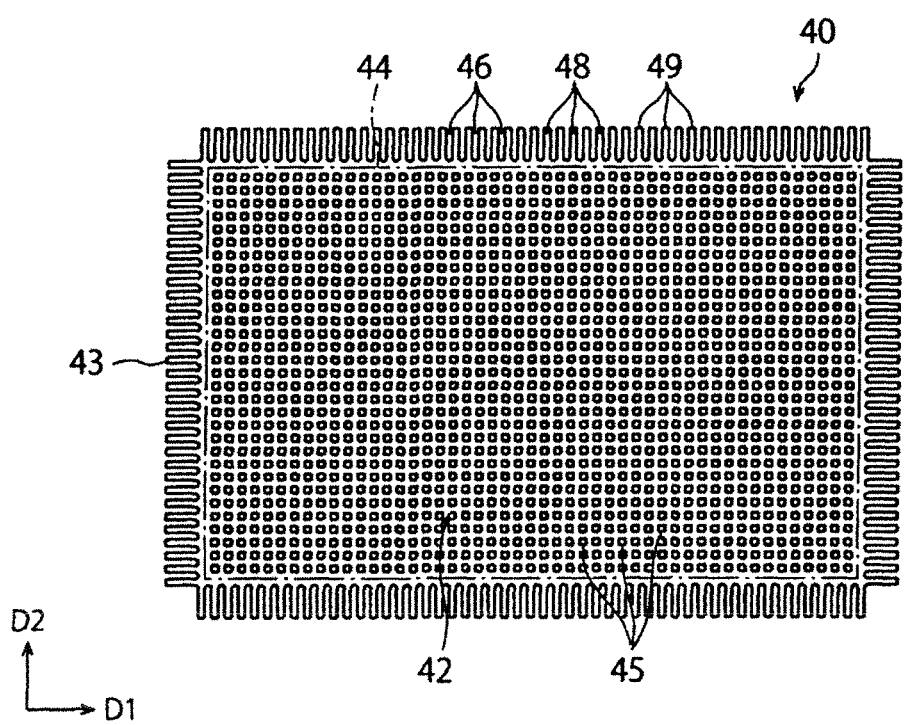
FIG. 6 is a plan view showing an example of a second mask of the deposition mask.

Next, the second mask 40 is described. FIG. 6 is a plan view showing the second mask 40 of the deposition mask apparatus 10 of FIG. 3. As shown in FIG. 6, the plurality of through-holes 45 of the second mask 40 are formed over the whole area of a porous area 44 including an area overlapping with the plurality of openings 35 of the first mask 30. The example shown in FIG. 6 can make uniform rigidity of the second mask 40 and an internal stress (residual stress) generated in the second mask 40, as compared with a case in which the through-holes 45 are provided in only a part corresponding to a display area of the substrate to be deposited (substrate for organic EL) 92. Thus, it can be prevented that irregularities such as wrinkles are generated in the second mask 40 because of the non-uniform rigidity and/or internal stress. There may be an area in which no through-hole 45 is formed outside the porous area 44 of the metal layer 42 of the second mask 40.

Returning to FIG. 1, a through-hole 45 of the through-holes 45 of the second mask 40, which is not overlapped with the opening 35 of the first mask 30, is covered by a plate member 32 of the first mask 30 from the first surface 20a side of the deposition mask 20. In this case, the deposition material 98, which flies from the deposition source positioned on the first surface 20a side with respect to the deposition mask 20, reaches the substrate to be deposited 92 through a through-hole 45 of the through-holes 45 of the second mask 40, which is overlapped with the opening 35 of the first mask 30.

Figure 7:
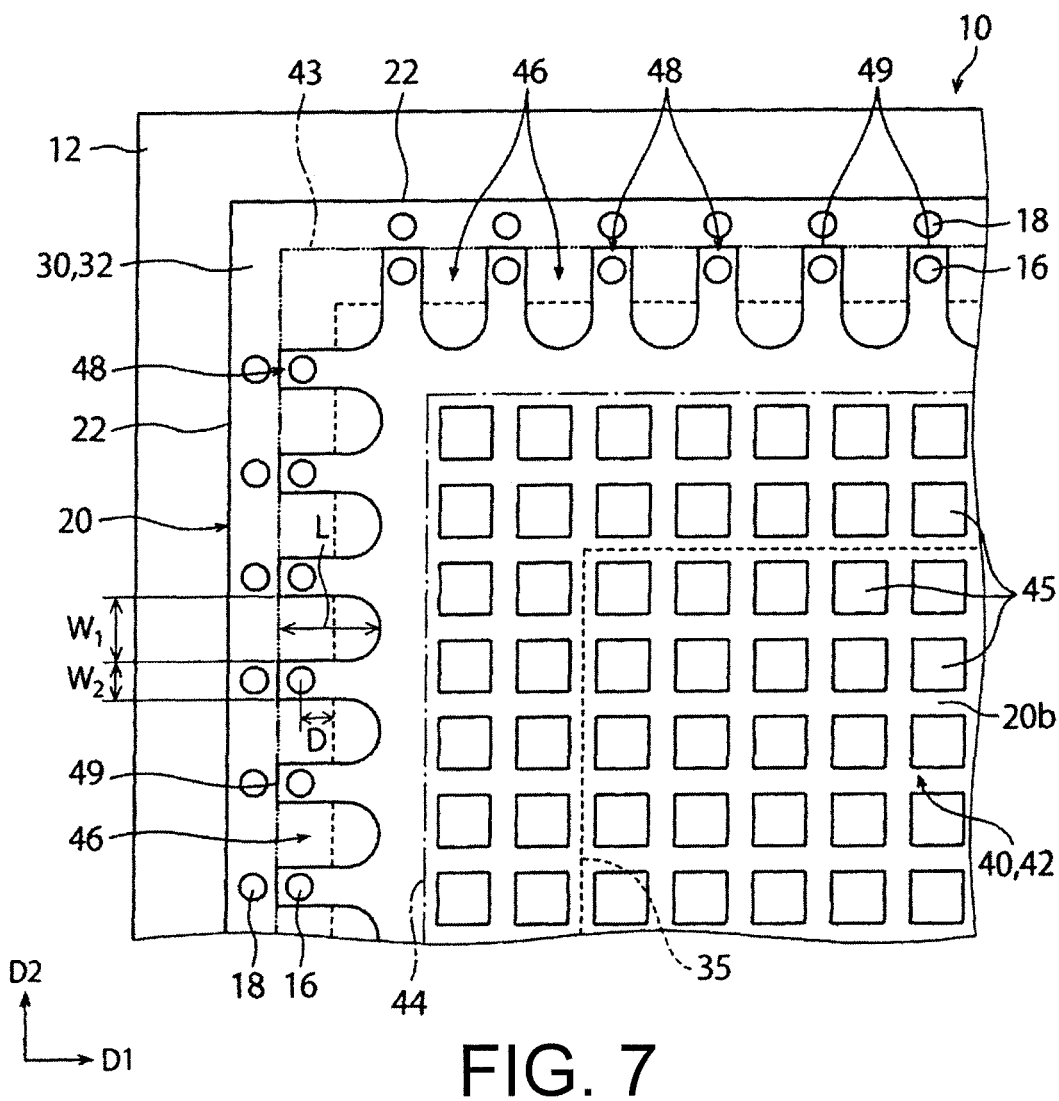
FIG. 7 is a partial plan view of the deposition mask apparatus, showing a part indicated by VII in FIG. 3, which is seen from a second surface side of the deposition mask.

Herebelow, an example of a specific shape of the deposition mask apparatus 10, in particular, a specific shape of the second mask 40, is described in detail with reference mainly to FIG. 7. FIG. 7 is a partial plan view of the deposition mask apparatus 10, showing a part surrounded by one-dot chain lines indicted by VII of FIG. 3, which is seen from the second surface 20b side of the deposition mask 20.

In the example shown in FIG. 7, the through-hole 45 hashas an outline of, for example, a substantially quadrangular shape in a plan view, more precisely, a substantially rectangular shape in a plan view. However, although not shown, each through-hole 45 can have an outline of a different shape in accordance with the shape of the pixel of the organic EL display device 100. For example, each through-hole 45 may have a circular outline or a slit-like outline.

A notch 46 is formed at a position in the outer edge 43 of the second mask 40, the position corresponding to a space between the adjacent two first joints 16. Herein, the position in the outer edge 43 of the second mask 40, the position corresponding to a space between the adjacent two first joints 16, indicates a part of the outer edge 22, which is positioned from a position between the adjacent two first joints 16 in a direction orthogonal to a direction connecting the adjacent two first joints 16 in the plate plane of the second mask 40. Particularly in the example shown in FIGS. 6 and 7, the notch 46 is formed in the outer edge 43 of the second mask 43 to include a position corresponding to a center between the adjacent two first joints 16. Namely, the notch 46 is formed to include a part of the outer edge 22, which is positioned from a position at a center between the adjacent two first joints 16 in a direction orthogonal to a direction connecting the adjacent two first joints 16 in the plate plane of the second mask 40.

Since the second mask 40 has such notches 46, an etchant can penetrate from the outer edge 43 side of the second mask 40 through the notches 46, in a separation step of the manufacturing method of the deposition mask 20 described later. Thus, a conductive pattern 52 located near the outer edge 43 can be easily etched and removed.

Each notch 46 extends from the outer edge 43 of the second mask 40 toward the porous area 44. In the example shown in FIGS. 6 and 7, the notch 46 has a certain width and extends from the outer edge 43 of the second mask 40 toward the porous area 44. In the illustrated example, corners of an end of the notch 46 on the porous area 44 side are rounded. In particular, the end of the notch 46 on the porous area 44 side has a substantially semicircular shape. Thus, when an external force is applied to the second mask 40, it can be prevented that a stress is concentrated on a certain area in the notch 46 so that the area is cracked and/or deformed.

A joint piece 48 is formed between the adjacent two notches 46. In other words, the joint piece 48 is positioned between the adjacent two notches 46. The second mask 40 is joined to the first mask 30 at the joint piece 48. Namely, the joint piece 48 and the first mask 30 are fixed to each other through the first joint 16. In the example shown in FIGS. 6 and 7, one first joint 16 is located on one joint piece 48. In the illustrated example, a plurality of joint pieces 48 is arranged along the outer edge 43 of the second mask 40. The plurality of joint pieces 48 are equidistantly arranged along a direction in which the outer edge 22 extends.

Each joint piece 48 extends from the outer edge 43 of the second mask 40 toward the porous area 44 in a plan view. In the example shown in FIGS. 6 and 7, the joint piece 48 has a certain width, excluding a part of its area on the porous area 44 side, and extends from the outer edge 43 of the second mask 40 toward the porous area 44.

In the illustrated example, each joint piece 48 is disposed on an outermost circumference of the second mask 40. An end 49, which is positioned on the opposite side of the porous area 44 along the direction in which each joint piece 48 extends, defines a part of the outer edge 43 of the second mask 40. Thus, in this embodiment, a substantially rectangular virtual line formed by connecting the respective ends 49 of the plurality of joint pieces 48 defines the outer edge 43 of the second mask 40.

In the outer edge 43 of the second mask 40, the notch 46 has a first width W1 along the direction in which the outer edge extends. In addition, the joint piece 48 has a second width W2 along the direction in which the outer edge 22 extends. In this embodiment, the first width W1 of the notch 46 is larger than the second width W2 of the joint piece 48. Thus, in the separation step of the manufacturing method of the deposition mask described later, an etchant can penetrate from the outer edge 43 side of the second mask 40 through the notch 46 having the first width W1 that is larger than the second width W2 of the joint piece 48. Thus, the conductive pattern 52 located near the outer edge 43 can be more easily etched and removed. The first width W1 of the notch 46 may be not less than 1 mm and not more than 10 mm, for example. The second width W2 of the joint piece 48 may be not less than 1 mm and not more than 3 mm, for example. In addition, a length L of the joint piece 48 (a length of the notch 46) may be not less than 1 mm and not more than 5 mm, for example.

Next, an example of the manufacturing method of the deposition mask 20 is described with reference to FIGS. 8 to 12. FIGS. 8 to 12 are cross-sectional views of respective members to show examples of respective steps of the deposition mask 20.

Firstly, an example of a method of producing a pattern substrate 50 used for manufacturing the vapor deposition mask apparatus 10 is described. A substrate 51 is firstly prepared. A material forming the substrate 51 and a thickness of the substrate 51 are not specifically limited, as long as they offer an insulation property and a suitable strength. As described below, when the first mask 30 and the second mask 40 are welded and fixed by laser beam irradiation through the substrate 51, a glass material having a high light transmissivity can be suitably used as a material forming the substrate 51.

Then, a conductive pattern 52 is formed on one surface of the substrate 51. In the illustrated example, the conductive pattern 52 has a pattern corresponding to a pattern of the second mask 40 to be formed in the below-described film deposition step. For example, the conductive pattern 52 has the same pattern as the pattern of the second mask 40 to be formed in the below-described film deposition step. A conductive material such as a metal material or an oxide conductive material is suitably used as a material forming the conductive pattern 52. For example, a metal material may be chromium or copper. Preferably, a material having a high bonding property to the below-described covering layer is used as a material forming the conductive pattern 52. For example, when the covering layer is produced by patterning a so-called dry film, such as a resist film containing an acryl-based photosetting resin, copper is preferably used as a material forming the conductive pattern 52.

Figure 8:
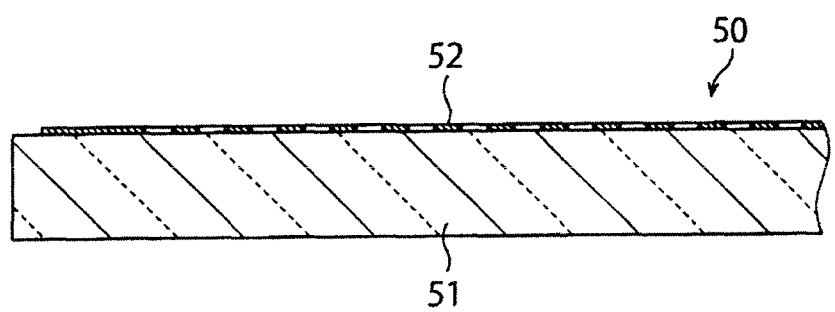
FIG. 8 is a view showing a step of an example of a manufacturing method of the deposition mask.

The conductive pattern 52 may be formed by removing by etching, for example, a part of the conductive layer disposed on the substrate 51, which is other than a part for defining the conductive pattern 52. In more detail, a conductive layer formed of the aforementioned conductive material is firstly provided on the substrate 51 by sputtering or electroless plating. Then, a covering layer having a predetermined pattern is formed on the conductive layer. A photolithographic method may be employed as a method for forming the covering layer. Thereafter, a part of the conductive layer, which is not covered with the covering layer, is removed by etching, and then the covering layer is removed. Thus, as shown in FIG. 8, the pattern substrate 50 on which the conductive pattern 52 having the pattern corresponding to the second mask 40 is formed can be obtained. A thickness of the conductive pattern 52 (a thickness of the conductive layer) may be not less than 50 nm and not more than 300 nm, for example.

Then, a film deposition step in which a metal layer 42 is formed on the conductive pattern 52 is performed. In the film deposition step, a metal layer 42 provided with through-holes 45 is formed on the conductive pattern 52. To be specific, a plating step in which a plating solution is supplied onto the substrate 51 on which the conductive pattern 52 is formed so as to precipitate the metal layer 42 on the conducive pattern 52, is performed. For example, the substrate 51 on which the conductive pattern 52 is formed is immersed into a plating bath filled with a plating solution. Thus, as shown in FIG. 9, the metal layer 42 which will become the second mask 40 can be formed on the conductive pattern 52.

A specific method of the plating step is not particularly limited, as long as the metal layer 42 can be precipitated on the conductive pattern 52. For example, the plating step may be performed as a so-called electrolytic plating step in which a current is applied to the conductive pattern 52 so as to precipitate the metal layer 42 on the conductive pattern 52. Alternatively, the plating step may be an electroless plating step. When the plating step is an electroless plating step, a suitable catalyst layer may be provided on the conductive pattern 52. Also when an electrolytic plating step is performed, a catalyst layer may be provided on the conductive pattern 52.

Ingredients of the plating solution to be used are suitably determined in accordance with properties required for the metal layer 42. For example, as the plating solution, a mixed solution containing nickel sulfamate or nickel bromide and a solution containing ferrous sulfamate may be used. The plating solution may contain various additives. Examples of additives that can be used include pH buffers such as boric acid, primary brighteners such as saccharin sodium, secondary brighteners such as butynediol, propargyl alcohol, coumarin, formalin and thiourea, and antioxidants.

Figure 9:
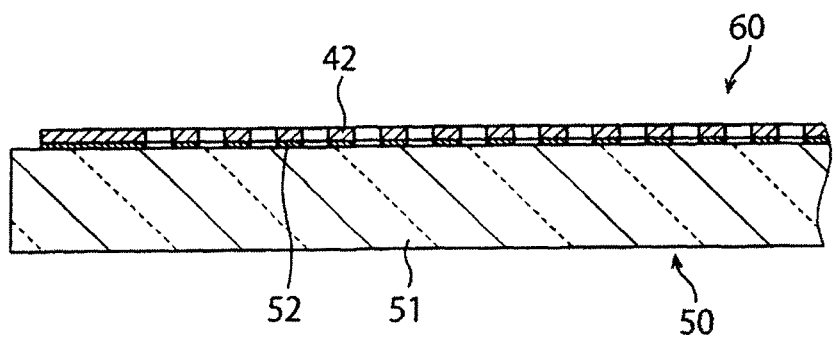
FIG. 9 is a view showing a step of an example of a manufacturing method of the deposition mask.

By this film deposition step, a laminated body 60 having the pattern substrate 50 and the metal layer 42, as shown in FIG. 9, can be produced. In the illustrated example, the laminated body 60 has the substrate 51, the conductive pattern 52 provided on the substrate 51, and the metal layer 42 provided on the conductive pattern 52 on the opposite side of the substrate 51. After the film deposition step, the laminated body 60 may be cut at a position which will become the outer edge 43 of the second mask 40.

Then, a joint step in which the first mask 30 and the metal layer 42 are joined to each other is performed. In the joint step, the metal layer 42 of the laminated body 60 is joined to the first mask 30 by a plurality of first joints (joints) 16. Particularly in this embodiment, the joint pieces 48 in the metal layer 42 are joined to the first mask 30. For example, spot welding may be employed as the joint method. In the example shown in FIG. 10, the first mask 30 and the metal layer 42 are fixed to each other by laser spot welding.

Figure 10:
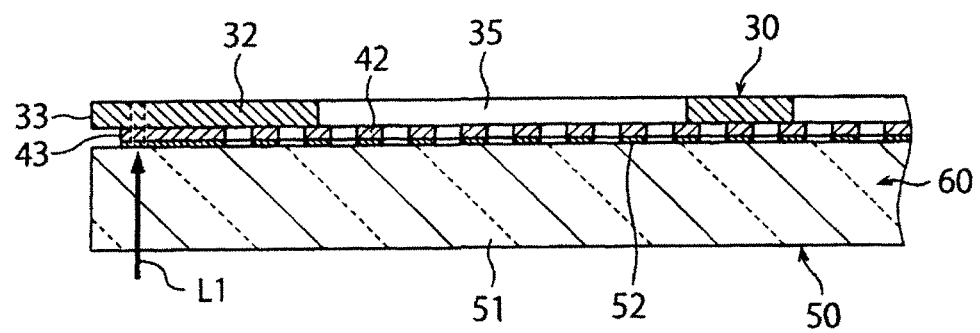
FIG. 10 is a view showing a step of an example of a manufacturing method of the deposition mask.
Figure 11:
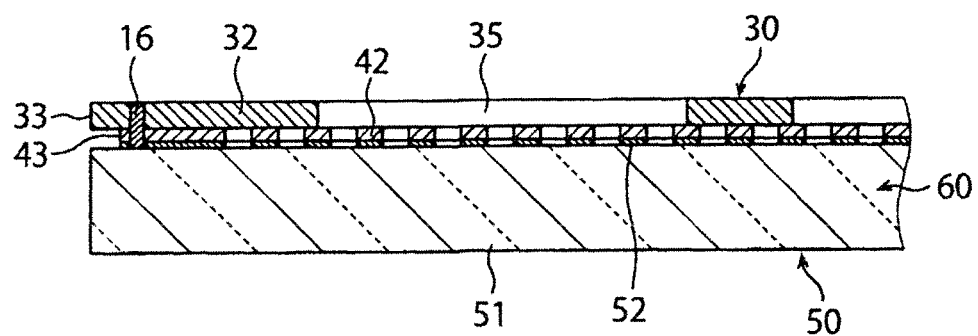
FIG. 11 is a view showing a step of an example of a manufacturing method of the deposition mask.

In the example shown in FIG. 10, the first mask 30 is superposed on the metal layer 42 such that the first mask 30 in which a plurality of openings are formed and the metal layer 42 are in contact with each other. In this embodiment, as well shown in FIGS. 3 and 7, the outer edge 33 of the first mask 30 is positioned outside the outer edge 43 of the metal layer 42 (the outer edge of the second mask 40) in the planar direction. Then, the joint piece 48 of the metal layer 42 is irradiated with a laser beam L1 from the substrate 51 side through the substrate 51 to melt a part of the joint piece 48 and a part of the first mask 30 by heat generated by the irradiation of the laser beam L1, so that the joint piece 48 and the first mask 30 are welded and fixed. At this time, as shown in FIG. 11, a first joint 16 made of the parts of the first mask 30 and the metal layer 42, which have been melted and then solidified, is formed across the joint piece 48 and the first mask 30. Namely, the first mask 30 and the metal layer 42 are joined to each other through the first joint 16. At this time, since the thickness of the metal layer 42 (second mask 40) and the thickness of the conductive pattern 52 are smaller than the thickness of the first mask 30, the metal layer 42 and the first mask 30 can be joined in a short period of time with less energy, by applying the laser beam L1 from the substrate side 51, i.e., from the metal layer 42 side with respect to the first mask 30.

For example, a YAG laser beam generated by a YAG laser system can be used as the laser beam L1. For example, as a YAG laser system, a system including a crystal of YAG (yttrium aluminum garnet) doped with Nd (neodymium) as an oscillation medium can be used.

In this manner, by joining the first mask 30 and the metal layer 42 to each other while the metal layer 42 is being supported on the substrate 51, flatness of the metal layer 42 can be well ensured. Thus, generation of wrinkles and/or deformation of the metal layer 42 can be prevented. In the joint step, the first mask 30 and the metal layer 42 may be joined while a circumference of the first mask 30 is being pulled, i.e., stretched outside in an in-plane direction. In this case, after the separation step described later, it can be prevented that the first mask 30 is deformed by a residual stress in the metal layer 42 so that the deposition mask 20 is deformed as a whole.

Then, a separation step in which a combined body of the first mask 30 and the metal layer 42 is separated from the substrate 51 is performed. In the separation step, the combined body is firstly immersed into an etchant capable of selectively etching the conductive pattern 52. Then, the combined body is peeled and separated from the substrate 51. Thereafter, the combined body is again immersed into the etchant so as to completely etch and remove the conductive pattern 52 remaining on the metal layer 42. Thus, the substrate 51 is separated from the metal layer 42, so that a second mask 40 can be formed from the metal layer 42.

In the example shown in FIG. 11, the conductive pattern 52 positioned in the opening 35 of the first mask 30 in a plan view is exposed into the through-holes 45 of the second mask 40. Thus, the conductive pattern 52 is etched by the etchant having penetrated into the through-hole 45 from a surface exposed into the through-hole 45, i.e., a side surface. In the illustrated example, the etching proceeds from the side surface of the conductive pattern 52 to the inside. Thus, the metal layer 42 of the second mask 40 and the substrate 51 are separated.

In addition, in the separation step, the etchant penetrates into the notch 46 from the outer edge 43 side of the second mask 40. The conductive pattern 52 present between the joint piece 48 and the substrate 51 is exposed into the notch 46. Thus, the conductive pattern 52 is etched by the etchant having penetrated into the notch 46 from a surface exposed into the notch 46, i.e., the side surface. By using as the etchant an etchant that does not dissolve the first mask 30 and the second mask 40 but dissolves only the conductive pattern 51, only the conductive pattern 52 can be dissolved and removed, without the first mask 30 and the second mask 40 being eroded by the etchant. The etching proceeds from the side surface of the conductive pattern 52, which corresponds to opposed side surfaces of the point piece 48, to the inside. Thus, the metal layer 42 of the second mask 40 and the substrate 51 are separated.

In the step of etching and removing the conductive pattern 52, the metal layer 42 (second mask 40) and the substrate 51 may not be completely separated. Namely, the metal layer 42 and the substrate 51 may be connected partially by the conductive pattern 52. In this case, by peeling the substrate 51 from the combined body of the first mask 30 and the second mask 40 to break the conductive pattern 52 which partially connects the metal layer 42 and the substrate 51, the substrate 51 can be separated from the combined body. The conductive pattern 52 remaining on the metal layer 42 can be completely etched and removed by again immersing the combined body into the etchant.

Figure 12:
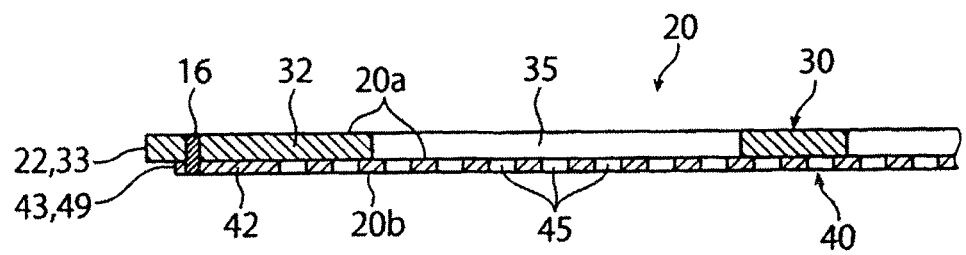
FIG. 12 is a view showing a step of an example of a manufacturing method of the deposition mask.

By these steps, the deposition mask 20 having the first mask 30 and the second mask 40, as shown in FIG. 12, can be obtained.

Figure 13:
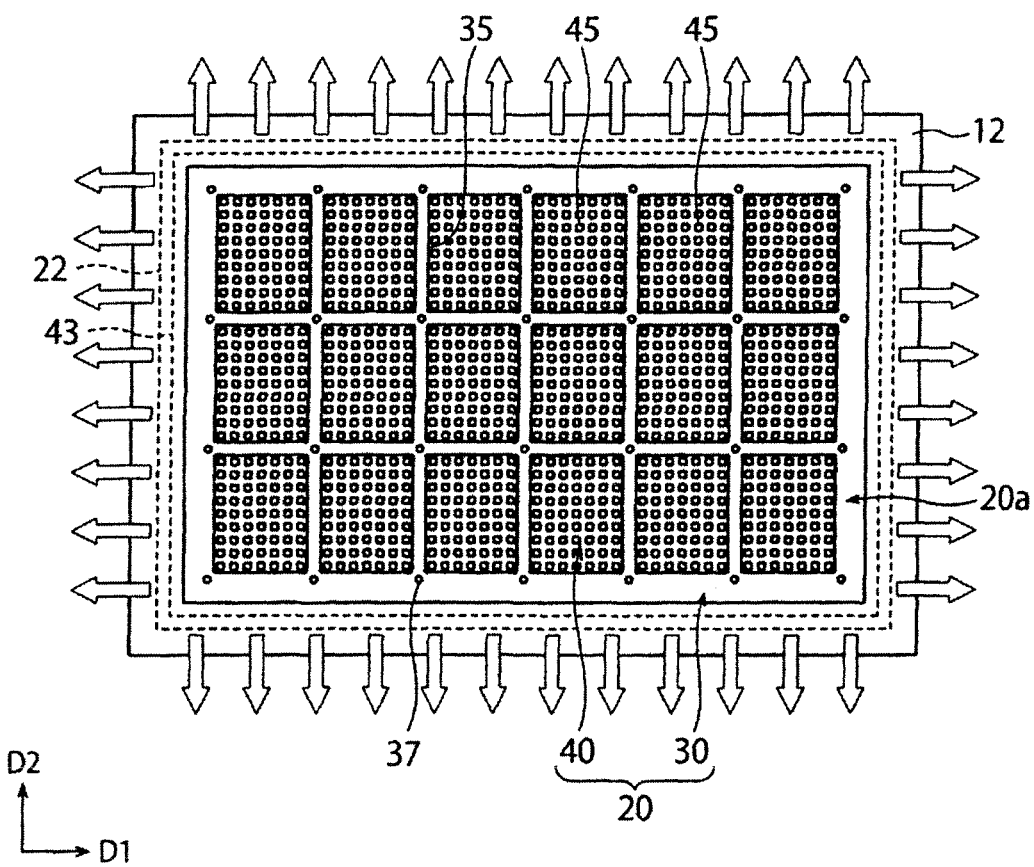
FIG. 13 is a view showing a step of an example of a manufacturing method of the deposition mask apparatus.
Figure 14:
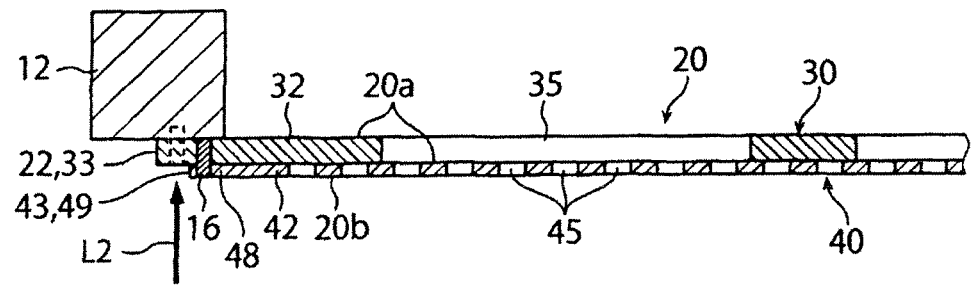
FIG. 14 is a view showing a step of an example of a manufacturing method of the deposition mask apparatus.

Next, an example of the manufacturing method of the deposition mask apparatus 10 is described with reference to FIGS. 13 and 14. FIG. 13 is a plan view showing the deposition mask 20 and the frame 12, in particular, showing the deposition mask 20 seen from the first surface 20a side. FIG. 14 is a cross-sectional view showing the deposition mask 20 and the frame 12.

Firstly, the deposition mask 20, which is manufactured by the manufacturing method described above with reference to FIGS. 8 to 12, is prepared.

Then, a stretching step in which tension is given to the deposition mask 20 in the planar direction, i.e., the deposition mask 20 is stretched in its planar direction, is performed. As shown in FIG. 13, the respective sides of the rectangular deposition mask 20 are held by a plurality of clamps, not shown, and the respective clamps are pulled outside in the planar direction with respect to the deposition mask 20, so that the deposition mask 20 is stretched.

Since the metal layer 42 of the second mask 40 is a metal layer precipitated by a plating method, a residual stress (internal stress) is generated in the metal layer 42, which results in a tensile force in the plane of the metal layer 42. A power of the tensile force varies depending on a thickness and/or a composition of the metal layer 42. The metal layer 42 formed of a plated layer inevitably has non-uniform thickness and/or composition in its plane. In this case, the tensile force in the plane of the metal layer 42 may become non-uniform. Thus, in the metal layer 42 from which the substrate 51 has been removed, there is a possibility that positions of the respective through-holes 45 are displaced from predetermined positions.

In order to correct the positions of the respective through-holes 45 so that the respective through-holes 45 are located at the predetermined positions, tensile forces of the respective clamps are individually adjusted. At this time, the alignment marks 37 provided on the first mask 30 are recognized by an imaging device such as a camera and the tensile forces of the respective clamps are individually adjusted such that the alignment marks 37 are located at predetermined positions, whereby the respective through-holes 45 can be located at the predetermined positions. Thus, it can be said that the stretching step is an alignment step in which the positions of the respective through-holes 45 are aligned with the predetermined positions. The stretching step is performed before an attachment step described below. The alignment of the through-holes 45 using the alignment marks 37 can be carried out similarly to the method described in JP4606114B2 or JP4562488B2, for example.

Then, an attachment step in which the deposition mask 20 is attached to the frame 12 is performed. In the attachment step, the deposition mask 20 is joined to the frame 12 through a plurality of second joints 18. Particularly in this embodiment, a part near the outer edge 33 of the first mask 30 of the deposition mask 20 is joined to the frame 12. For example, spot welding may be employed as the joint method. In the example shown in FIG. 14, the first mask 30 and the frame 12 are fixed to each other by laser spot welding.

Firstly, as shown in FIG. 13, the stretched deposition mask 20 is aligned with the frame 12 so as to be disposed in contact with the frame 12. Particularly in the illustrated example, as well shown in FIG. 14, the deposition mask 20 is disposed such that a surface on the opposite side of the second mask 40 is in contact with the frame 12 at a part near the outer edge 33 of the first mask 30. Then, the deposition mask 20 (first mask 30) is irradiated with a laser beam L2 from the second surface 20*b* side to melt a part of the first mask 30 and a part of the frame 12 by heat generated by the irradiation of the laser beam L2, so that the first mask 30 and the frame 12 are welded and fixed to each other. At this time, the second joint 18 made of the parts of the first mask 30 and the frame 12, which have been melted and then solidified, is formed across the first mask 30 and the frame 12. Namely, the first mask 30 and the frame 12 are joined to each other through the second joint 18. Thus, the deposition mask apparatus 10 shown in FIG. 4 can be manufactured.

As the laser beam L2 and a laser system emitting the laser beam L2, the laser bean and the laser system used in the joint step in the aforementioned manufacturing method of the deposition mask 20 can be used.

As a comparative embodiment, a case in which the deposition mask has only the second mask, and the deposition mask is manufacture by directly joining ten second mask to the frame is considered.

In this case, in order to manufacture the deposition mask apparatus, the attachment step is performed firstly. In the attachment step, the frame is disposed so as to be in contact with the metal layer of the laminated body shown in FIG. 9. Then, the metal layer is irradiated with a laser beam from the substrate side through the substrate to melt a part of the metal layer and a part of the frame by heat generated by the irradiation of the laser beam, so that the metal layer and the frame are welded and fixed to each other.

Then, the separation step is performed. In the separation step, the combined body including the substrate, the conductive pattern, the metal layer and the frame is immersed into an etchant capable of selectively etching the conductive pattern. Then, the metal layer is peeled and separated from the substrate. Thus, the substrate is removed from the metal layer so as to form the second mask from the metal layer, whereby the deposition mask apparatus having the second mask (deposition mask) and the frame 12 can be obtained.

As compared with the substrate, the frame has relatively a larger weight because of its increased thickness dimension and increased density. Thus, in the comparative embodiment, when the combined body is held such that the frame is positioned above the substrate, the substrate is subjected to the weight of the frame and may be broken. Thus, in the comparative embodiment, in the separation step, it is necessary that the combined body is held such that the substrate is positioned above the frame. In this case, the substrate, the conductive pattern, the metal layer and the frame are disposed in this order from above. The combined body under this state is immersed into the etchant, air enters an area surrounded by the frame below the metal layer, so that bubbles may be generated. Since it is difficult for the etchant to penetrate into a part where the bubbles are present, an etching progress rate may become non-uniform in a plane of the conductive pattern. As a result, there may be a part where the conductive pattern is not sufficiently etched and removed. In this case, when the substrate is peeled from the metal layer, the metal layer is partially pulled hard, which may cause the metal layer to be broken or wrinkled.

On the other hand, in this embodiment, in the separation step, it is the first mask 30 having the thickness smaller than the thickness of the frame that is joined to the second mask 40. Thus, in the separation step, the first mask 30, the second mask 40, the conductive pattern 52 and the substrate 51 are held such that the substrate 51 is positioned above the first mask 30 and the second mask 40, and they are immersed into the etchant. Thus, bubbles are unlikely to be generated below the metal layer. Thus, it can be prevented that an etching progress rate becomes non-uniform in a plane of the conductive pattern. As a result, when the substrate is peeled from the metal layer, it can be prevented that the metal layer is broken or wrinkled.

In addition, the frame has a general rigidity that is larger than that of the substrate. Thus, in the comparative embodiment, when the substrate is peeled from the metal layer, a force applied for peeling is concentrated on the substrate, whereby there is a possibility that the substrate and/or metal layer are broken. In particular, in the step of etching and removing the conductive pattern, when the metal layer and the substrate are not completely separated and the metal layer and the substrate are partially connected by the conductive pattern, it is highly probable that the substrate and/or the metal layer are broken.

On the other hand, in this embodiment, in the separation step, it is the first mask 30 having the general rigidity larger than the rigidity of the frame that is joined to the second mask 40. Thus, when the substrate is peeled from the metal layer, it can be prevented that a force applied for peeling is concentrated on the substrate.

In addition, in the comparative embodiment, since the frame has relatively a larger dimension and weight, a larger apparatus (e.g., transfer apparatus, etching bath) that handles the combined body may be needed, which invites rise in cost of the apparatus, increase in installation area, etc.

On the other hand, in this embodiment, since the first mask 30 has a dimension and a weight smaller than those of the frame, the apparatus that handles the combined body can be made smaller. Particularly in the below-described modification example where the first mask 30 having a reduced dimension is used, the apparatus that handles the combined body can be made further smaller.

Next, a deposition method for depositing the deposition material 98 onto the substrate to be deposited 92 using the deposition mask 20 according to this embodiment is described.

Firstly, the deposition mask 20, which is manufactured by the manufacturing method described above with reference to FIGS. 8 to 12, is prepared (preparation step). In this embodiment, as described above with reference to FIGS. 13 and 14, the deposition mask 20 is fixed on the frame 12, and is prepared as the deposition mask apparatus 10. Then, the deposition mask apparatus 10 is positioned such that the deposition mask 20 is opposed to the substrate to be deposited 92 (positioning step). At this time, the deposition mask 20 is brought into tight contact with the substrate to be deposited 92 by using the magnet 93. Under this state, the substrate to be deposited 92, the deposition mask apparatus 10 and the magnet 93 are loaded into the deposition apparatus 90 (loading step). However, not limited thereto, after the substrate to be deposited 92, the deposition mask apparatus 10 and the magnet 93 have been respectively loaded into the deposition apparatus 90, the deposition mask apparatus 10 may be positioned such that the deposition mask 20 is opposed to the substrate to be deposited 92. Thereafter, the atmosphere (air) in the deposit apparatus 90 is discharged by the exhaust means, not shown, so as to decompress the inside of the deposition apparatus 90 (exhaust step). Then, the deposition material 98 is evaporated to fly to the substrate to be deposited 92 through the deposition mask 20, so that the deposition material 98 is deposited onto the substrate to be deposited 92 in a pattern corresponding to the through-holes 25 of the deposition mask 2 (deposition step). After the deposition step has ended, an atmosphere is introduced into the deposition apparatus 90 so that the inside of the deposition apparatus 90 returns to a normal pressure (introduction step). Finally, the substrate to be deposited 92 with the deposition material 98 adhered thereto, the deposition mask 20, the frame 12 and the magnet 93 are unloaded from the deposition apparatus 90 (unloading step). Then, the deposition mask 20 is peeled from the substrate to be deposited 92, and the deposition mask 20, the frame 12 and the magnet 93 are removed (removal step).

The deposition mask 20 in this embodiment comprises the first mask 30 having the opening 35 formed therein, and the second mask 40 superposed on the first mask 30 and having a plurality of through-holes 45 formed therein, the through-hole 45 having a planar dimension smaller than a planar dimension of the opening 35, wherein the deposition mask 20 has a plurality of joints 16 that join the second mask 40 and the first mask 30 to each other, the plurality of joints 16 are arranged along an outer edge 43 of the second mask 40, and the notch 46 is formed at a position in the outer edge 43 of the second mask 40, the position corresponding to a space between the adjacent two joints 16.

In addition, the deposition mask apparatus 10 in this embodiment comprises the aforementioned deposition mask 20, and the frame 12 attached to the deposition mask 20.

According to such a deposition mask 20, upon manufacture of the deposition mask 20, in the separation step in which the substrate 51 is separated from the combined body of the first mask 30 and the metal layer 42, since an etchant can penetrate from the outer edge 43 side of the second mask 40 through the notch 46, the conductive pattern 52 located near the outer edge 43 can be easily etched and removed.

The manufacturing method of the deposition mask 20 in this embodiment is a manufacturing method of the deposition mask 20 including the first mask 30 having the opening 35 formed therein, and the second mask 40 superposed on the first mask 30 and having a plurality of the through-holes 45 formed therein, the through-hole 45 having a planar dimension smaller than a planar dimension of the opening 35, the manufacturing method comprising: a joint step in which the metal layer 42 of the laminated body 60 is joined to the first mask 30 by a plurality of the joints 16, wherein the laminated body 60 includes the substrate 51, the conductive pattern 52 provided on the substrate 51, and the metal layer 42 provided on the conductive pattern 52 on the opposite side of the substrate 51; and a separation step in which the substrate 51 is separated from the metal layer 42 by etching and removing the conductive pattern 52 so as to form the second mask 40 from the metal layer 42.

According to such a manufacturing method of the deposition mask 20, by joining the first mask 30 and the metal layer 42 to each other while the metal layer 42 is being supported on the substrate 51, flatness of the metal layer 42 can be well ensured. Thus, generation of wrinkles and/or deformation of the metal layer 42 can be prevented.

In the manufacturing method of the deposition mask 20 in this embodiment, the plurality joints 16 are arranged along the outer edge 43 of the metal layer 42, and the notch 46 is formed at a position in the outer edge 43 of the metal layer 42, the position corresponding to a space between the two joints 16 that are adjacent to each other in the arrangement direction of the plurality of joints 16.

According to such a manufacturing method of the deposition mask 20, in the separation step in which the substrate 51 is separated from the combined body of the first mask 30 and the metal layer 42, since an etchant can penetrate from the outer edge 43 side of the second mask 40 through the notch 46, the conductive pattern 52 located near the outer edge 43 can be easily etched and removed.

The manufacturing method of the deposition mask apparatus 10 in this embodiment is a manufacturing method of the deposition mask apparatus 10 including the deposition mask 20 and the frame 12 attached to the deposition mask 20, the manufacturing method comprising: a preparation step in which the aforementioned deposition mask 20, or the deposition mask 20 manufactured by the aforementioned manufacturing method of the deposition mask 20, is prepared; and an attachment step in which the deposition mask 20 is attached to the frame 12.

In addition, the manufacturing method of the deposition mask apparatus 10 in this embodiment further comprises, before the attachment step, a stretching step in which the deposition mask 20 is stretched in a planar direction thereof.

When the metal layer 42 of the second mask 40 is a metal layer that is precipitated by using a plating method, a residual stress (internal stress) is generated in the metal layer 42 so that a tensile force may be generated in a plane of the metal layer 42. A power of the tensile force varies depending on a thickness and/or a composition of the metal layer 42. The metal layer 42 formed of a plated layer inevitably has non-uniform thickness and/or composition in its plane. In this case, the tensile force in the plane of the metal layer 42 may become non-uniform. Thus, in the metal layer 42 from which the substrate 51 has been removed, there is a possibility that positions of the respective through-holes 45 are displaced from predetermined positions, because of the in-plane non-uniformity of the tensile force.

According to the manufacturing method of the deposition mask apparatus 10 in this embodiment, the positions of the respective through-holes 45 are corrected such that the respective through-holes 45 are located at the predetermined positions by stretching the deposition mask 20, and then the deposition mask 20 can be attached to the frame 12. Thus, positional precision of the through-holes 45 of the deposition mask 20 can be improved. Namely, the possible displacement of the through-holes 45 of the deposition mask 20 can be effectively prevented.

The aforementioned embodiment can be variously modified. Herebelow, modification examples are described with reference to the drawings according to need. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

Figure 15:
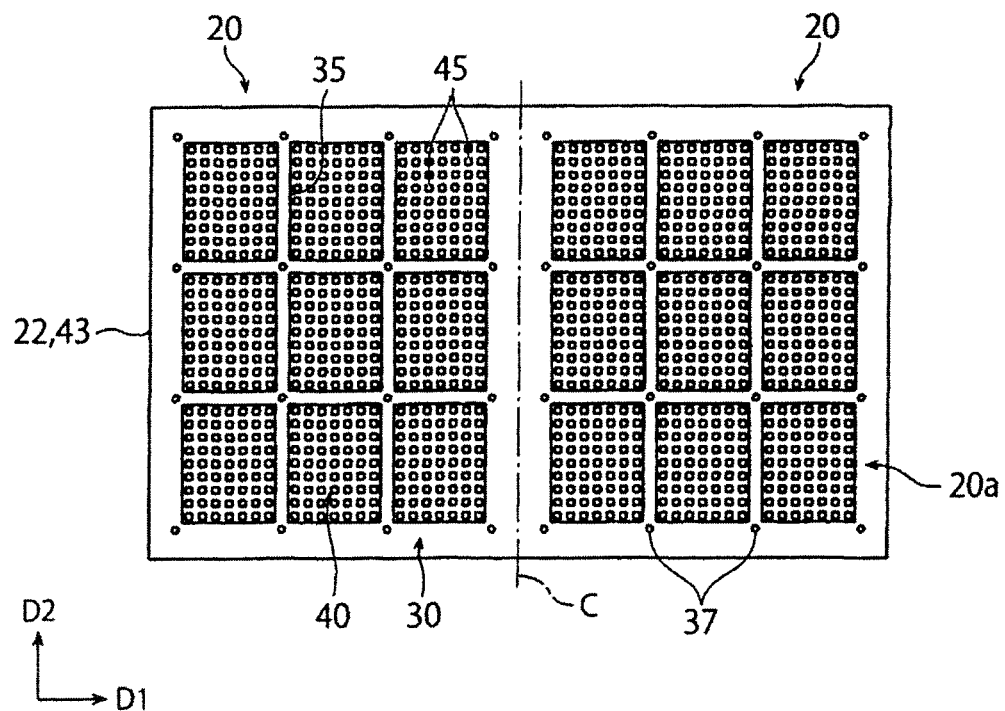
FIG. 15 is a view showing a step of an example of a manufacturing method of the deposition mask apparatus.
Figure 16:
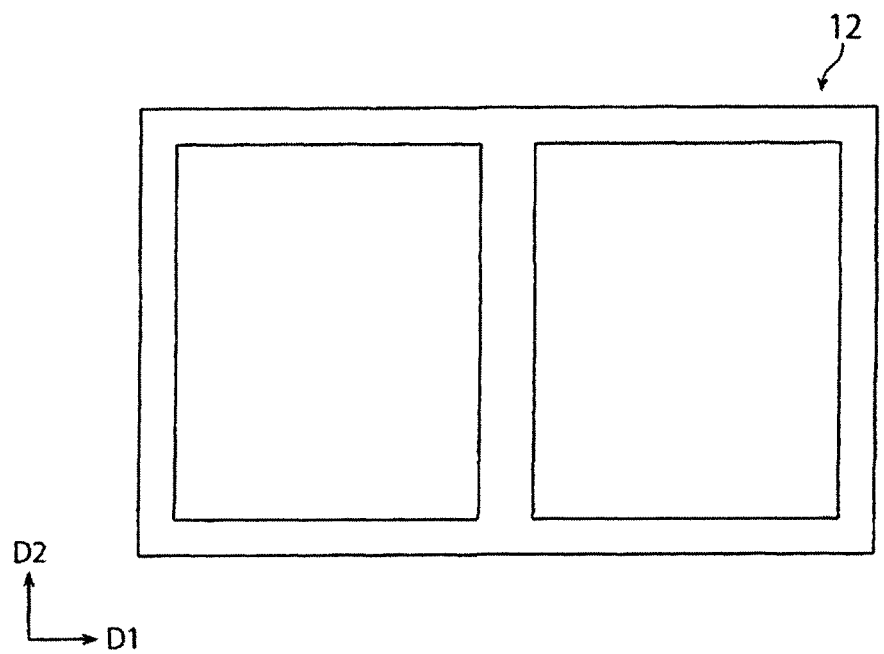
FIG. 16 is a view showing a step of a modification example of a manufacturing method of the deposition mask apparatus.
Figure 17:
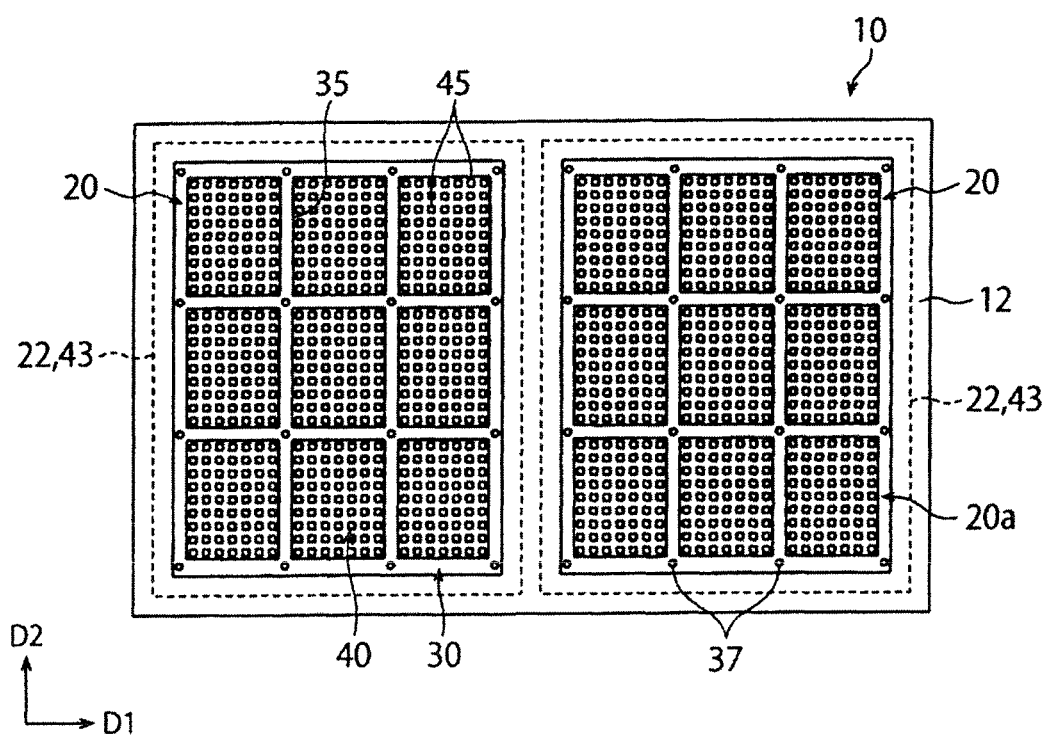
FIG. 17 is a view showing a step of a modification example of a manufacturing method of the deposition mask apparatus.

FIGS. 15 to 17 are views for describing a modification example of the manufacturing method of the deposition mask apparatus 10. FIGS. 15 to 17 are plan views of respective members to show the respective steps of the deposition mask apparatus 10 in this modification example.

In this modification example, a deposition mask 20 shown in FIG. 15, which was similarly manufactured by the manufacturing method of the deposition mask 20 described above with reference to FIGS. 8 to 12, is cut along a cutting line C so as to manufacture two deposition masks 20, for example.

Then, the two deposition masks 20 are stretched and respectively attached to a frame 12 shown in FIG. 16, so as to manufacture a deposition mask apparatus 10 shown in FIG. 17. In the example shown in FIG. 16, the frame 12 has a frame member formed to have a substantially rectangular shape in a plan view, and a connection member that connects center portions of a pair of opposed sides of two pairs of opposed sides constituting the frame member. The deposition mask 20 an be attached to the frame 12 similarly to the aforementioned attachment step.

According to this modification example, since the divided respective deposition masks 20 can be stretched independently of each other, correction of the positions of the respective through-holes 45 of the respective deposition masks 20 can be performed more precisely.

Figure 18:
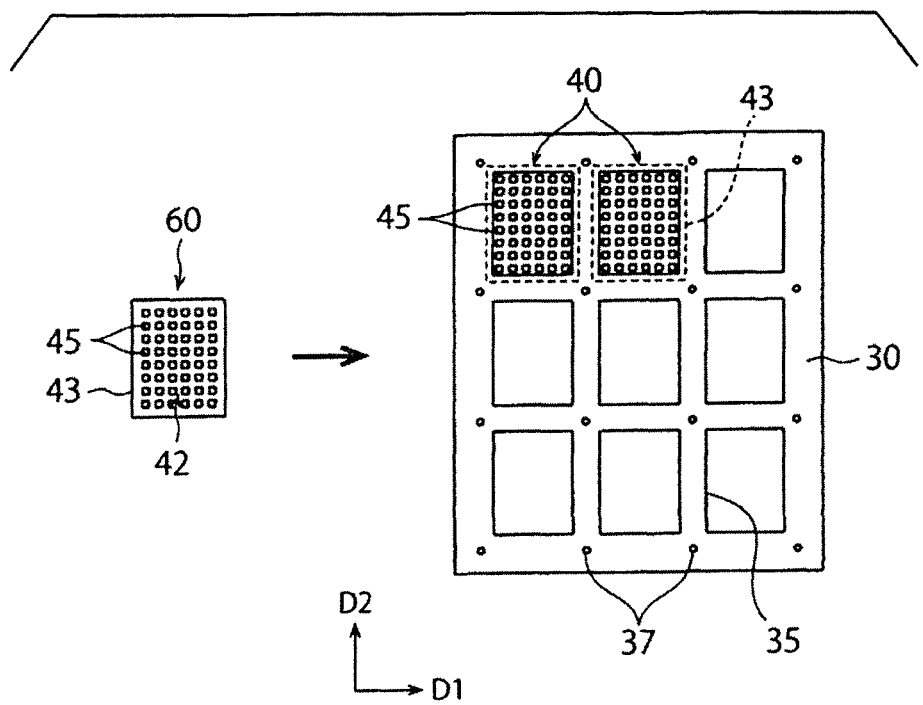
FIG. 18 is a view showing a step of another modification example of a manufacturing method of the deposition mask apparatus.
Figure 19:
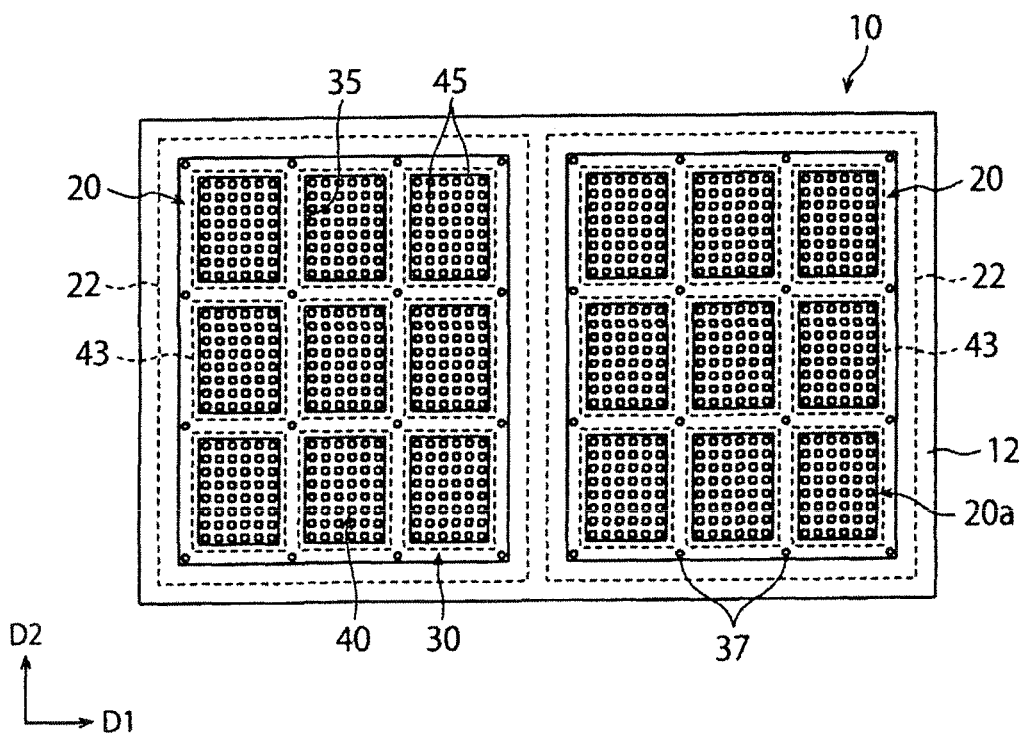
FIG. 19 is a view showing a step of another modification example of a manufacturing method of the deposition mask apparatus.

FIGS. 18 and 19 are views for describing another modification example of the manufacturing method of the deposition mask apparatus 10. FIGS. 18 and 19 are plan views of respective members to show the respective steps of the deposition mask apparatus 10 in this modification example.

As shown in FIG. 18, in this modification example, a plurality of laminated bodies 60 are firstly produced. Each laminated body 60 has a size corresponding to one opening 35 of a first mask 30. Then, each laminated body 60 is subjected to the aforementioned joint step and the separation step. For example, each laminated body 60 is aligned with the opening 35 of the first mask 30 and is joined to the first mask 30. The laminated body 60 can be joined to the first mask 30 similarly to the aforementioned joint step. Thereafter, the substrate 51 of each laminated body 60 is separated from a metal layer 42. Thus, a deposition mask 20 is produced. In this modification example, two deposition masks 20 are produced.

Then, the respective deposition masks 20 are stretched and respectively attached to a frame 12 shown in FIG. 16, for example, so as to manufacture a deposition mask apparatus 10 shown in FIG. 19. Not limited thereto, one large deposition mask 20 may be produced, and the deposition mask 20 may be attached to the frame 12 similarly to the frame 12 shown in FIG. 3.

According to this modification example, since the size of one laminated body 60 (second mask 40) corresponds to the size of one opening 35 of the first mask 30, a part of the laminated body 60 which is rejected because of a defective shape of a through-hole 45 can be reduced. Thus, a throughput can be improved as a whole.

Figure 20:
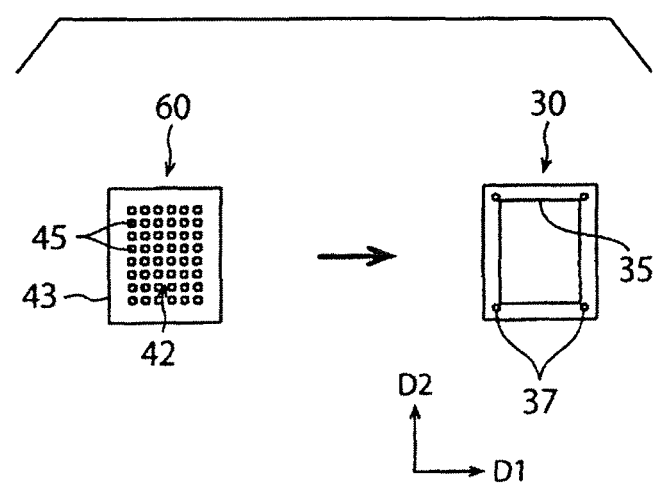
FIG. 20 is a view showing a step of yet another modification example of a manufacturing method of the deposition mask apparatus.
Figure 21:
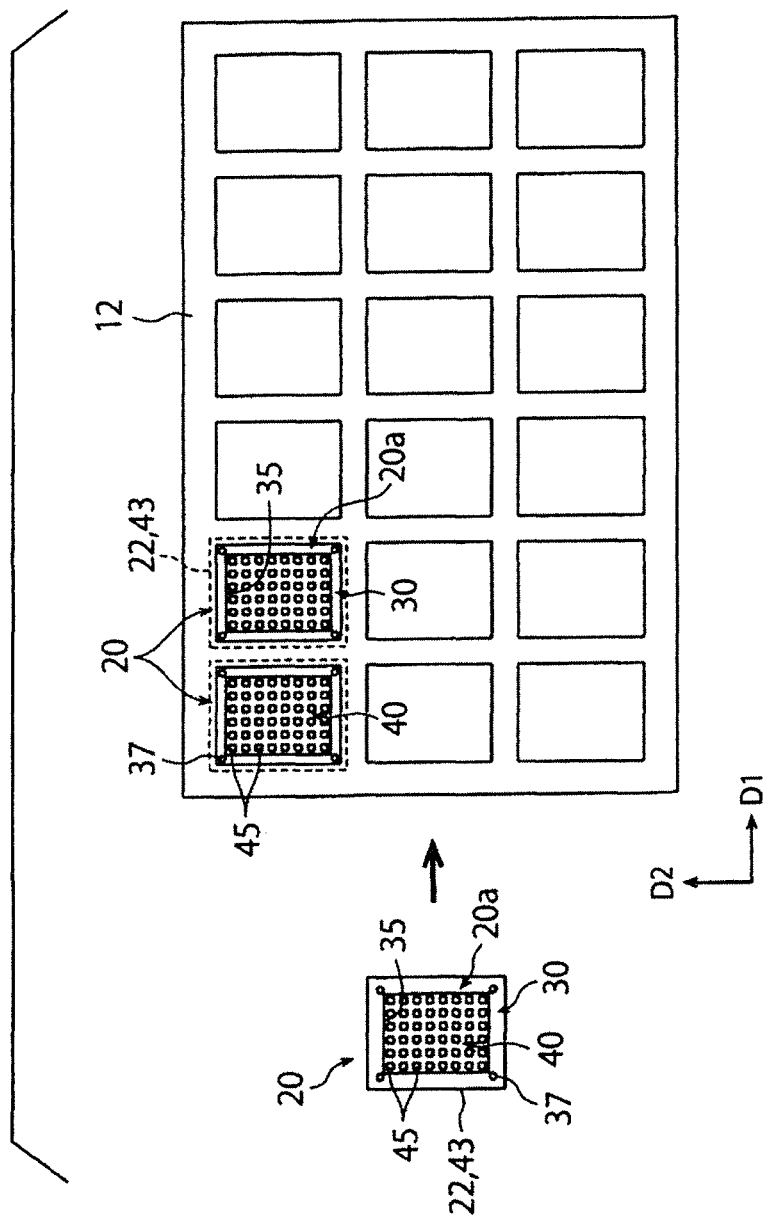
FIG. 21 is a view showing a step of yet another modification example of a manufacturing method of the deposition mask apparatus.
Figure 22:
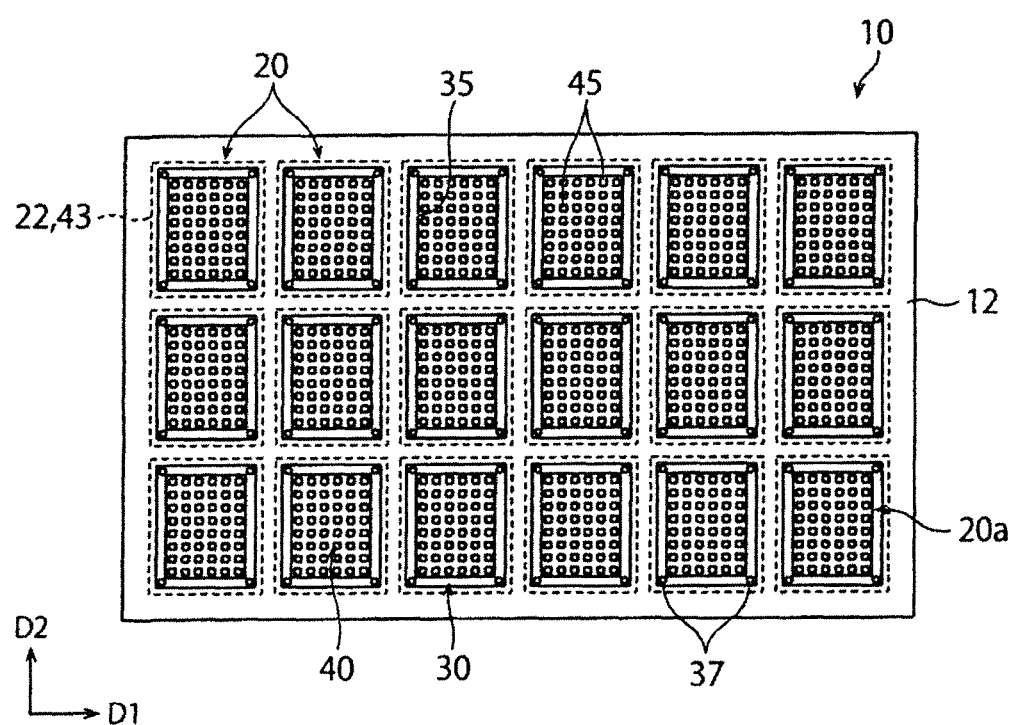
FIG. 22 is a view showing a step of yet another modification example of a manufacturing method of the deposition mask apparatus.

FIGS. 20 to 22 are views for describing yet another modification example of the manufacturing method of the deposition mask apparatus 10. FIGS. 20 to 22 are plan views of respective members to show the respective steps of the deposition mask apparatus 10 in this modification example.

As shown in FIG. 20, in this modification example, a plurality of laminated bodies 60 and a plurality of first masks 30 are produced. Each first mask 30 has one opening 35, and each laminated body 60 has a size corresponding to the one opening 35 of the first mask 30. Then, each laminated body 60 and each first mask 30 are subjected to the aforementioned joint step and the separation step. For example, one laminated body 60 is aligned with the first mask 30 and is joined to the first mask 30. The laminated body 60 can be joined to the first mask 30 similarly to the aforementioned joint step. Thereafter, a substrate 51 of each laminated body 60 is separated from a metal layer 42. Thus, one deposition mask 20 is produced. By repeating these step plural times, a plurality of the deposition masks 20 are produced.

Then, the respective deposition masks 20 are stretched, and are aligned with respective openings of a frame 12 shown in FIG. 21, for example, which has a grid-like plane shape, and are attached thereto, so as to manufacture a deposition mask 10 shown in FIG. 22.

According to this modification example, since the size of one laminated body 60 (second mask 40) corresponds to the size of one opening 35 of the first mask 30, a part of the laminated body 60 which is rejected because of a defective shape of a through-hole 45 can be reduced. Thus, a throughput can be improved as a whole.

Figure 23:
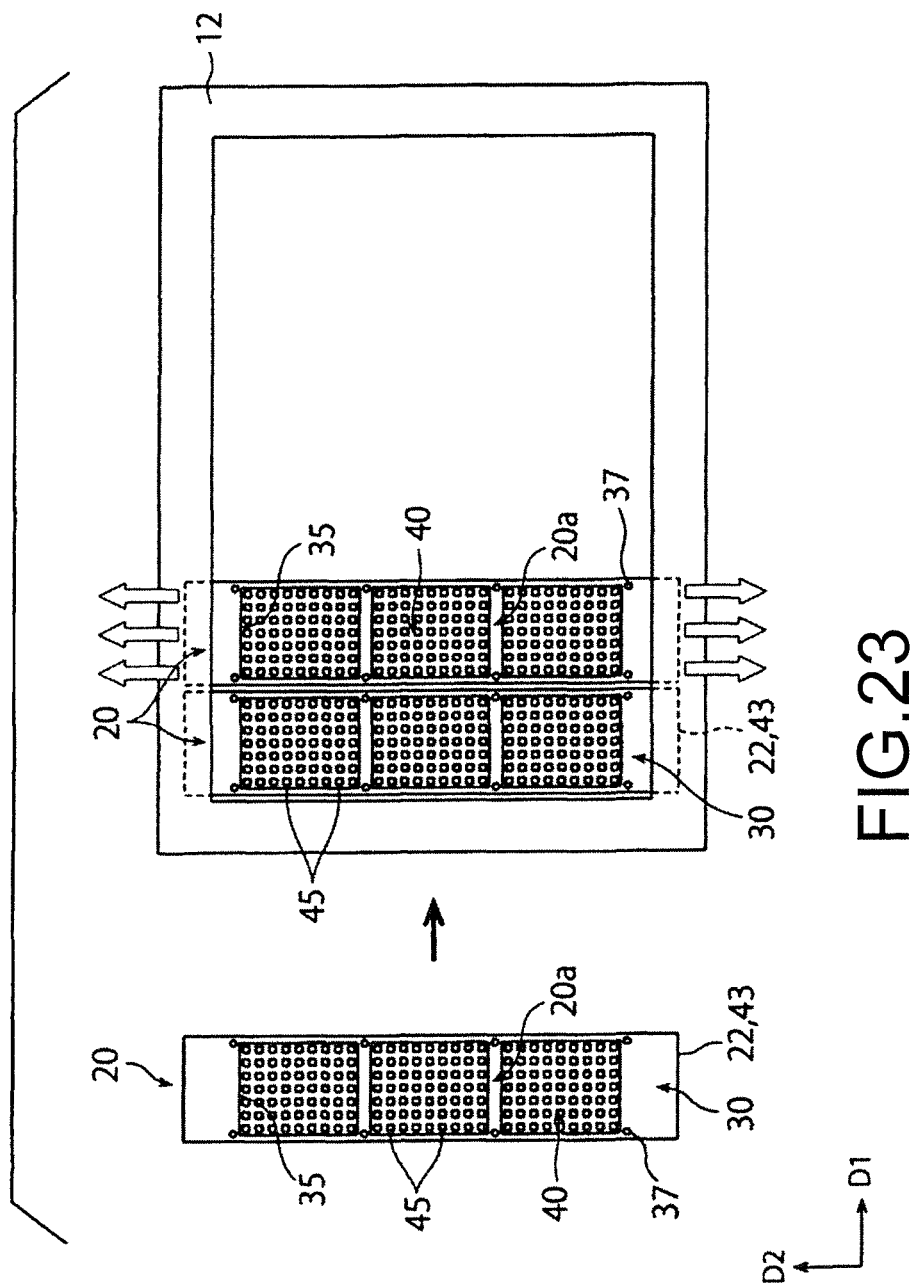
FIG. 23 is a view showing a step of yet another modification example of a manufacturing method of the deposition mask apparatus.
Figure 24:
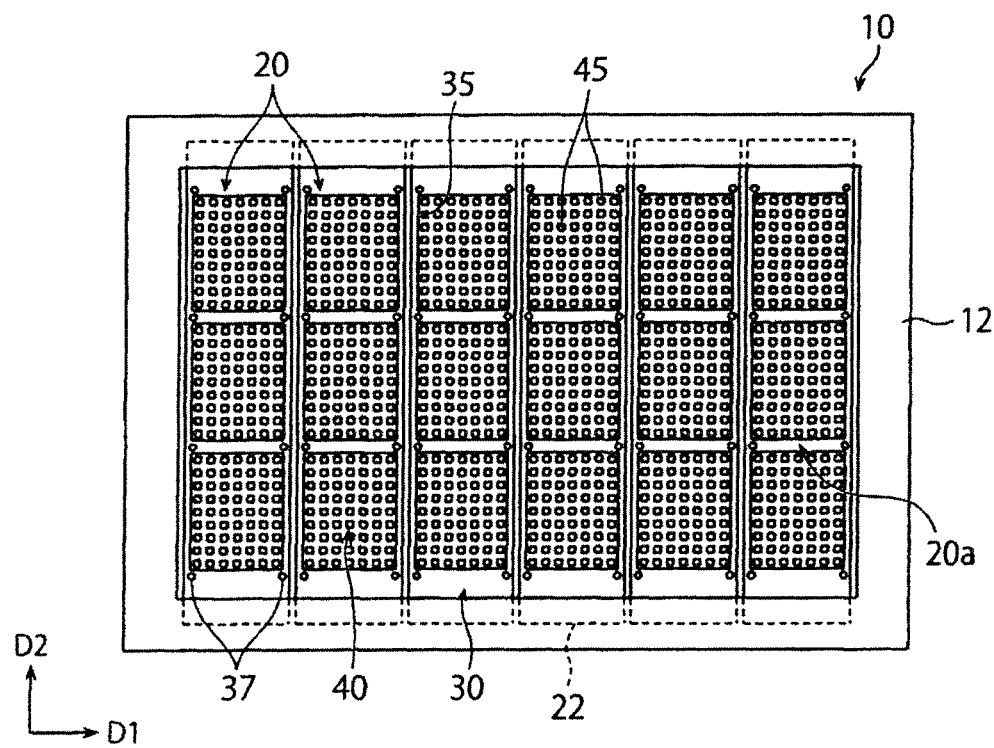
FIG. 24 is a view showing a step of yet another modification example of a manufacturing method of the deposition mask apparatus.

FIGS. 23 and 24 are views for describing yet another modification example of the manufacturing method of the deposition mask apparatus 10. FIGS. 23 and 24 are plan views of respective members to show the respective steps of the deposition mask apparatus 10 in this modification example.

In this modification example, a plurality of deposition masks 20 are firstly produced. As shown in FIG. 23, each deposition mask 20 includes a first mask 30 having a plurality of openings 35 arranged along one direction (second direction D2), and has a general stick-like plane shape extending in the one direction.

Then, the respective deposition masks 20 are stretched and respectively attached to a frame 12 shown in FIG. 3, for example, so as to manufacture a deposition mask apparatus 10 shown in FIG. 24. The deposition mask 20 can be attached to the frame 12 similarly to the aforementioned attachment step. However, in this modification example, in the stretching step, the deposition mask 20 having a stick-like plane shape can be stretched along the longitudinal direction (second direction D2), with only respective longitudinal ends of the deposition mask 20 being held by a plurality of clamps.

According to this embodiment, in the stretching step, since the positions of the respective through-holes 45 can be corrected by stretching the deposition mask 20 along the longitudinal direction thereof, the stretching step can be facilitated.

As yet another example, in the aforementioned respective modification examples described above with reference to FIGS. 15 to 24, a notch and a joint piece, which are similar to the notch 46 and the joint piece 48 described with reference to FIGS. 6a and 7, can be provided on the outer edges of the second masks 40 of the respective deposition masks 20.

Figure 25:
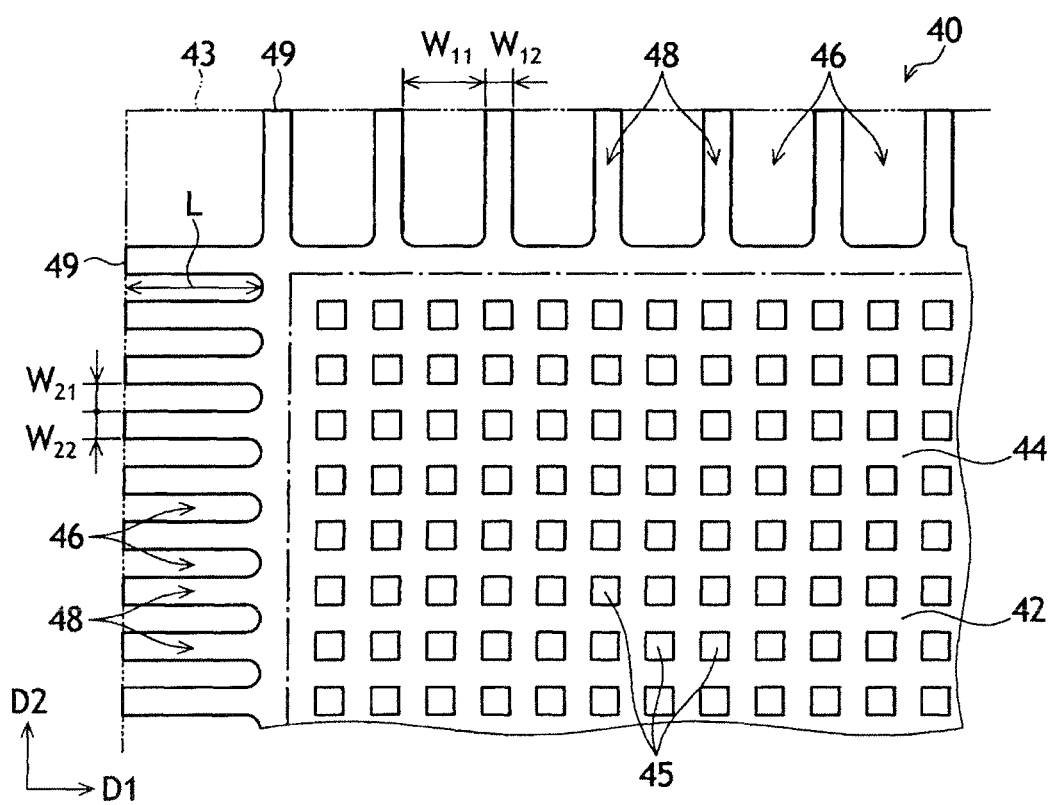
FIG. 25 is a partial plan view showing a modification example of a second mask.

FIG. 25 is a partial plan view showing a modification example of the second mask 40 of the deposition mask 20. In the illustrated example, a plurality of notches 46 are arranged along a long side of the second mask 40 (along the first direction D1), and a width $W_{11}$ of each notch 46 along the long side is larger than the first width $W_1$ of the notch 46 in the embodiment described above with reference to FIG. 6.

The plurality of notches 46 and the joint pieces 48 arranged along the long side of the second mask 40 (along the first direction D1) have the width $W_{11}$ and a width $W_{12}$, respectively. In addition, the plurality of notches 46 and the joint pieces 48 arranged along a short side of the second mask 40 (along the second direction D2) have a width $W_{11}$ and a width $W_{21}$, respectively. Particularly in the illustrated example, the width $W_{11}$ is larger than the width $W_{21}$. On the other hand, the width $W_{12}$ and the width $W_{22}$ may be the same with each other.

When the second mask 40 has the metal layer precipitated by a plating method, a residual stress (internal stress) is generated in the metal layer 42, which results in a tensile force in the plane of the metal layer 42. A power of the tensile force varies depending on a thickness and/or a composition of the metal layer. When the joint piece 48 of the second mask 40 is joined to the first mask 30 by welding, a thickness of the joint piece 48 of the second mask 40 is set to be larger than a thickness of the porous area 44, in order to ensure an appropriate joint property. Thus, a larger in-plane tensile force may be generated in the joint piece 48 than in the porous area 44.

In this modification example, since the width $W_{11}$ along the long side of the plurality of notches 46 arranged along the long side of the second mask 40 is larger than the first width $W_1$ of the notch 46 in the embodiment described above with reference to FIG. 6, the in-plane tensile force of the joint piece 48 can be reduced, whereby lowering of positional precision of the through-holes 45 in the porous area 44, which is caused by the in-plane tensile force, can be effectively prevented.

Figure 26:
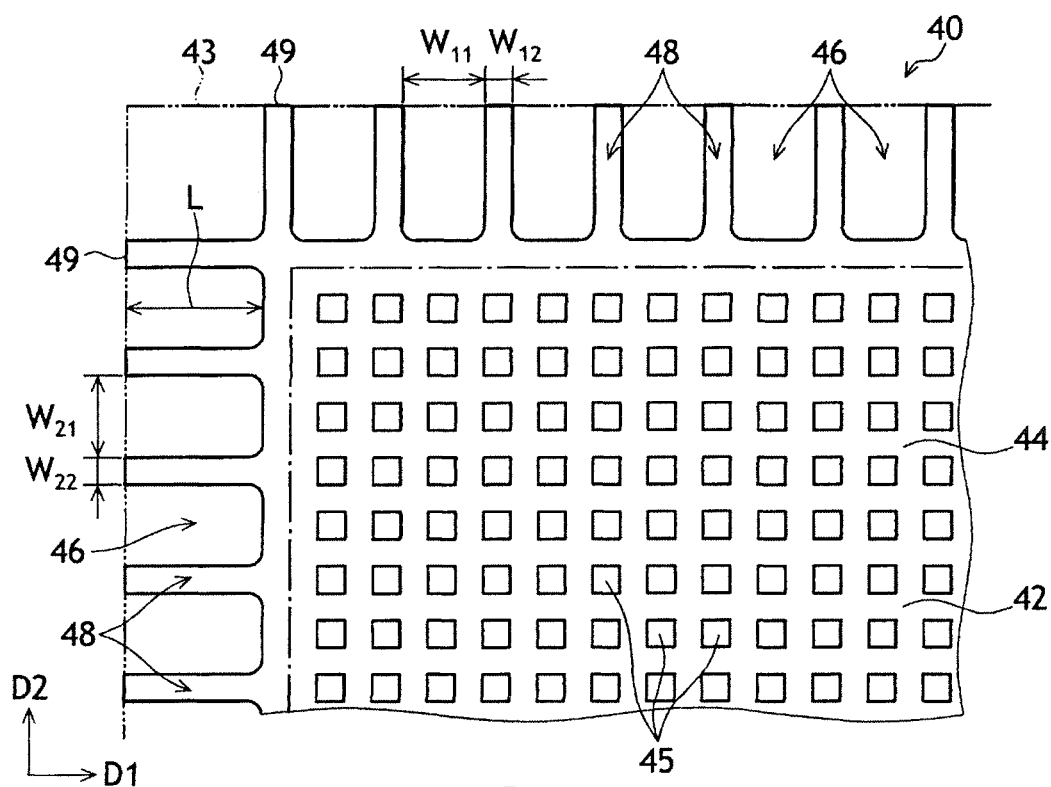
FIG. 26 is a partial plan view of another modification example of the second mask.

FIG. 26 is a partial plan view showing another modification example of the second mask 40. In the illustrated example, a plurality of notches 46 are arranged along a long side of the second mask 40 (along the first direction D1), and a width $W_{11}$ of each notch 46 along the long side is larger than the first width $W_1$ of the notch 46 in the embodiment described above with reference to FIG. 6. In addition, a plurality of notches 46 are arranged along a short side of the second mask 40 (along the second direction D2), and a width $W_{21}$ of each notch 46 along the short side is larger than the first width $W_1$ of the notch 46 in the embodiment described above with reference to FIG. 6. The width $W_{11}$ and the width $W_{21}$ may be the same with each other, and the width $W_{12}$ and the width $W_{22}$ of may be the same with each other.

Also according to such a modification example, similarly to the modification example described above with reference to FIG. 25, lowering of positional precision of the through-holes 45 in the porous area 44 can be effectively prevented.

Figure 27:
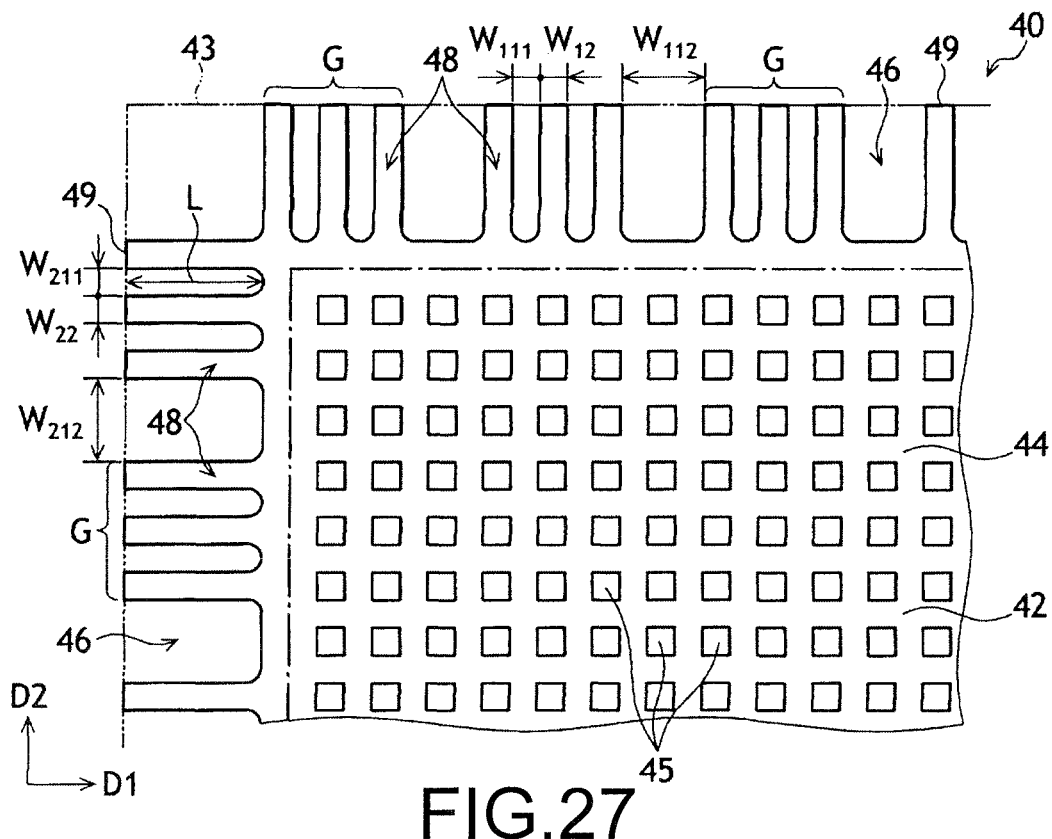
FIG. 27 is a partial plan view of yet another modification example of the second mask.

FIG. 27 is a partial plan view showing yet another modification example of the second mask 40. In this modification example, a width $W_{112}$ of some notches 46 of a plurality of notches 46 arranged along a long side of the second mask 40 (along the first direction D1) is larger than a width $W_{111}$ of other notches 46. Particularly in the illustrated example, the width $W_{112}$ of every third notch 46 is larger than the other width $W_{111}$ of the notches 46.

In addition, in the illustrated example, a width $W_{212}$ of some notches 46 of a plurality of notches 46 arranged along a short side of the second mask 40 (along the second direction D1) is larger than a width $W_{211}$ of other notches 46. Particularly in the illustrated example, the width $W_{212}$ of every third notch 46 is larger than the other width $W_{211}$ of the notches 46.

Thus, in the example shown in FIG. 27, the second mask 40 has a plurality of joint piece groups G arranged along its outer edge. One joint piece group G includes a plurality of joint pieces 48. Particularly in the illustrated example, one joint piece group G includes three joint pieces 48.

Also according to such a modification example, similarly to the modification example described above with reference to FIG. 25 and the modification example described above with reference to FIG. 26, lowering of positional precision of the through-holes 45 in the porous area 44 can be effectively prevented.

Figure 28:
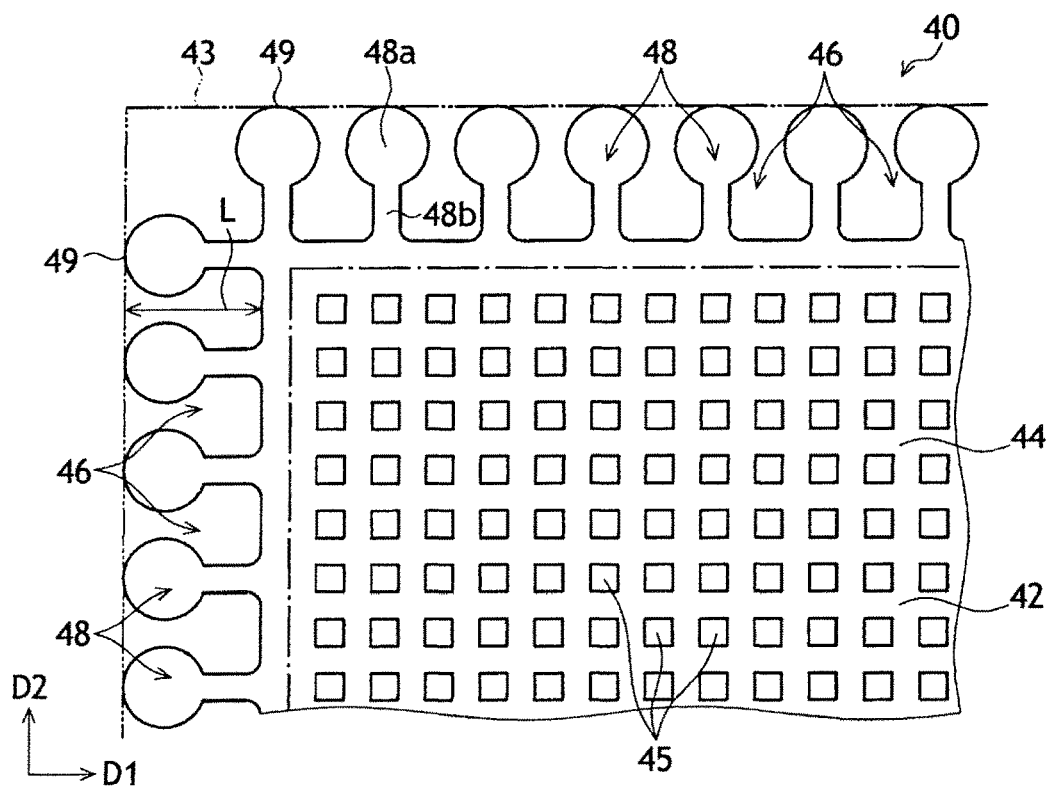
FIG. 28 is a partial plan view of yet another modification example of the second mask.
Figure 29:
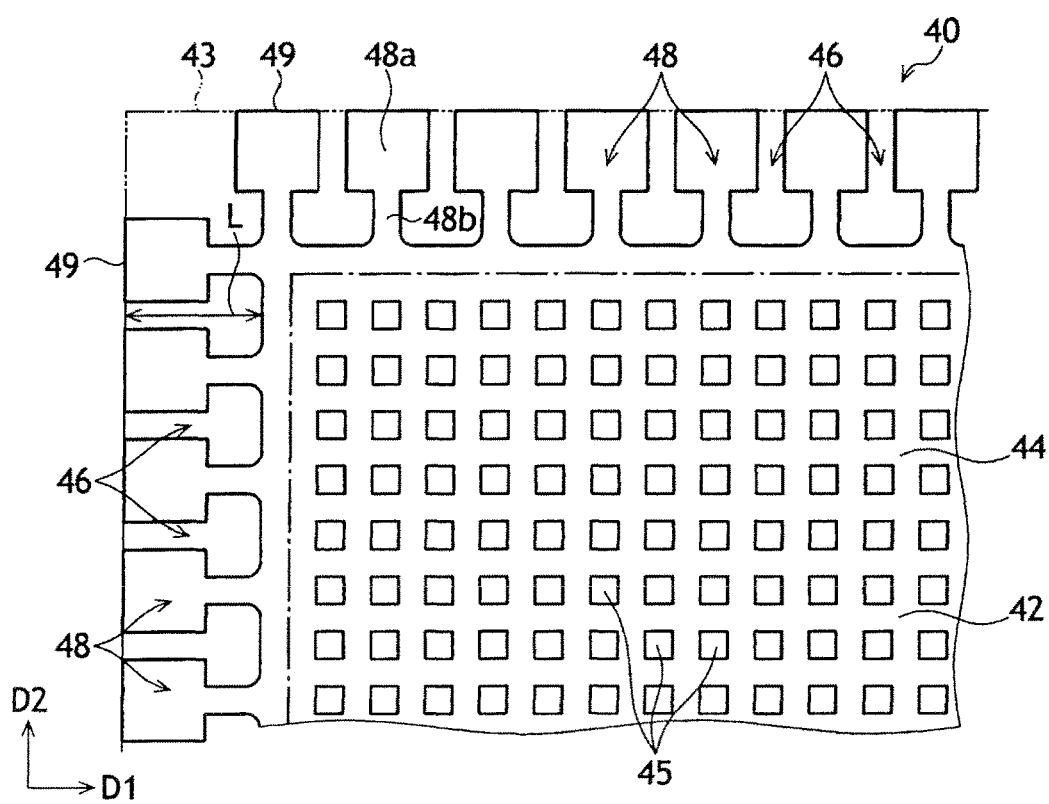
FIG. 29 is a partial plan view of yet another modification example of the second mask.

FIGS. 28 and 29 are partial plan view showing yet another modification example of the second mask 40. In the illustrated example, a width of a distal end 48a of a joint piece 48 is larger than a width of a proximal end 48b. Particularly in the example shown in FIG. 28, the distal end 48 has a substantially circular outline in a plan view. In the example shown in FIG. 29, the distal end 48a has a substantially rectangular outline in a plan view. Not limited to the substantially circular shape and the substantially rectangular shape, the distal end 48a can have any shape.

In the modification example shown in FIGS. 28 and 29, the distal ends 48a can be joined to the first mask 30 by welding. Thus, the distal end 48a having relatively a larger width can ensure a suitably joint property to the first mask 30, and the proximal end 48b having relatively a smaller width can reduce the in-plane tensile force of the joint piece 48, whereby lowering of positional precision of the through-holes 45 in the porous area 44, which is caused by the in-plane tensile force, can be effectively prevented.

Figure 30:
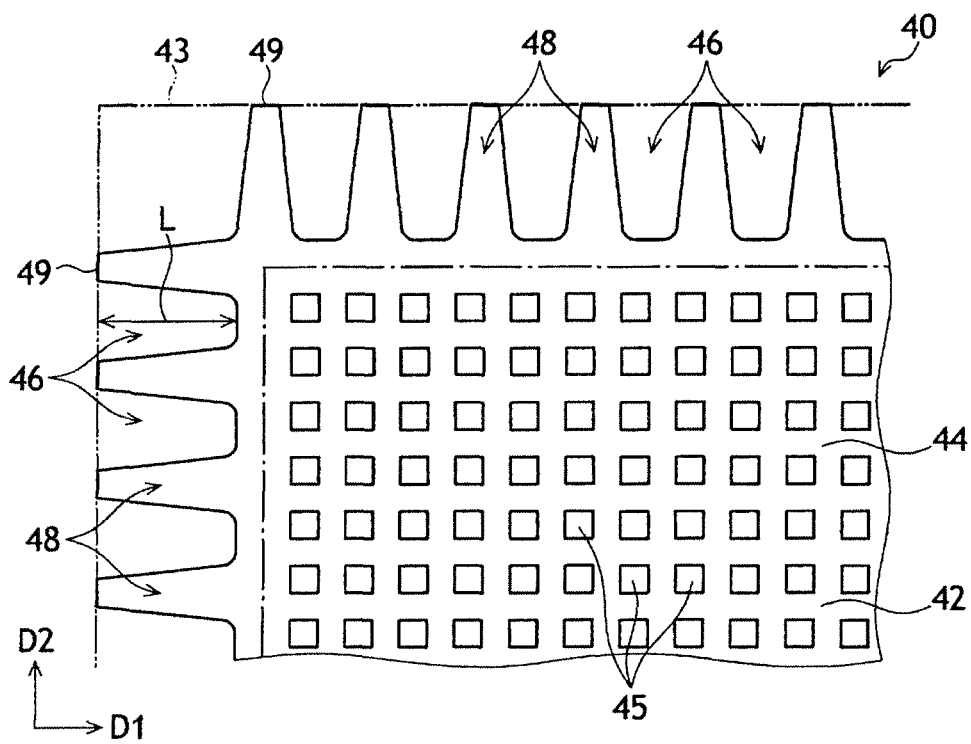
FIG. 30 is a partial plan view of yet another modification example of the second mask.

FIG. 30 is a partial view showing yet another modification example of the second mask 40. In the illustrated example, a width of a joint piece 48 increases from a distal end side (end 49 side) toward a proximal end side (porous area 44 side). Thus, the joint piece 48 has a substantially trapezoidal outline in a plan view. Particularly in the illustrated example, the joint piece 48 has substantially an isosceles trapezoidal shape in a plan view.

In the modification example shown in FIG. 30, since the width of the joint piece 48 on the proximal end side is larger, an in-plane tensile force applied to the porous area 44 from the joint piece 48 can be dispersed. Thus, the in-plane tensile force applied by the joint piece 48 can be applied uniformly to respective portions of the porous area 44, whereby lowering of positional precision of the through-holes 45 in the porous area 44, which is caused by the in-plane tensile force of the joint piece 48, can be effectively prevented.

Figure 31:
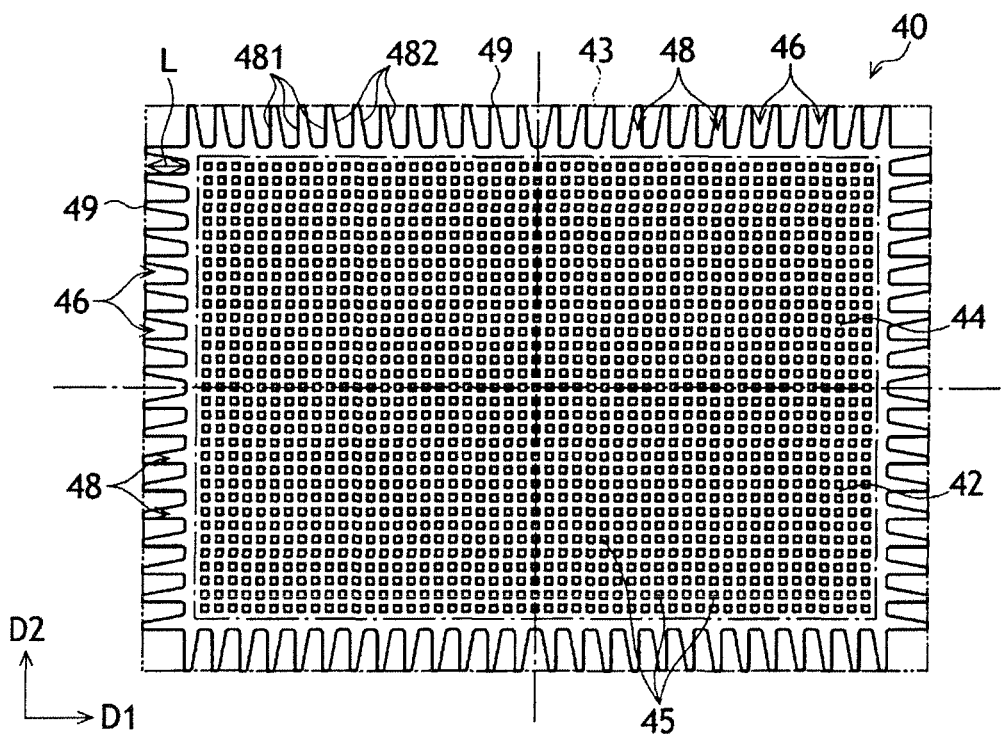
FIG. 31 is a plan view of yet another modification example of the second mask.

FIG. 31 is a plan view showing yet another modification example of the second mask 40. In the example shown in FIG. 31, similarly to the modification example described above with reference to FIG. 30, a width of a joint piece 48 increases from the distal end side of the joint piece 48 toward the proximal end side thereof. Thus, lowering of positional precision of the through-holes 45 in the porous area 44, which is caused by the in-plane tensile force of the joint piece 48, can be effectively prevented.

In the example shown in FIG. 31, the plurality of joint pieces 48 arranged along a long side of the second mask 40 and the plurality of joint pieces arranged along the long side of the second mask 40 have shapes different from each other, with respect to the center of the long side. In addition, the plurality of joint pieces 48 arranged along a short side of the second mask 40 and the plurality of joint pieces arranged along the short side of the second mask 40 have shapes different from each other, with respect to the center of the short side. The joint piece 48 has a substantially trapezoidal outline in a plan view, and has an end 49 and a proximal end, which form an upper base and a lower base of the trapezoidal shape, and two side edges 481, 482, which form legs of the substantially trapezoidal shape. The two side edges 481, 482 include a first side edge 481 facing a corner of the second mask 40 closest from the joint piece 48, and a second side edge 482 facing away from the corner.

An angle defined between the second side edge 482 of the joint piece 48 and the outer edge 43 of the joint piece 48, which passes the end 49, is larger than an angle defined between the first side edge 481 of the joint piece 48 and the outer edge 43 of the joint piece 48, which passes the end 49 of the joint piece 48. The angle defined between the side edge 481, 482 and the outer edge 43 is greater than 0 degrees and not more than 90 degrees. Particularly in the illustrated example, the angle defined between the first side edge 481 and the outer edge 43 is 90 degrees, and the angle defined between the second side edge 482 and the outer edge 43 is less than 90 degrees.

The present inventors have found that an in-plane tensile force in the metal layer 42 precipitated by a plating method acts relatively larger along a direction connecting a center of the second mask 40 and each corner thereof (diagonal direction). According to this modification example, an angle defined between an orientation in which the joint piece 48 extends from its proximal end toward its distal end, and an orientation in which an in-plane tensile force in the metal layer 42 largely acts can be made smaller. Thus, an in-plane tensile force acting on the porous area 44 can be prevented from becoming non-uniform.

What is claimed is:

1. A deposition mask comprising:
a first mask having openings formed therein; and
a second mask superposed on the first mask and having a plurality of through-holes formed therein, each through-hole having a planar dimension smaller than a planar dimension of each opening;
wherein:
the second mask has a rectangular outer edge;
the deposition mask has a plurality of joints that join the second mask and the first mask to each other;
the plurality of joints are arranged along all sides of the outer edge of the second mask; and
a notch is formed at a position corresponding to a space between two adjacent joints arranged along the same side of the outer edge of the second mask.

2. A deposition mask according to claim 1, wherein the notch extends inwardly from the outer edge of the second mask beyond the space directly between two adjacent joints.

3. A deposition mask according to claim 1, further comprising at least three notches formed along at least one side of the outer edge of the second mask.

4. A deposition mask according to claim 1, further comprising at least three notches formed along all sides of the outer edge of the second mask.

5. A deposition mask apparatus comprising:
the deposition mask according to claim 1; and
a frame attached to the deposition mask.

* * * * *